(12) United States Patent  
Rinerson et al.

(10) Patent No.: US 7,884,349 B2
(45) Date of Patent: Feb. 8, 2011

(54) SELECTION DEVICE FOR RE-WRITABLE MEMORY

(75) Inventors: Darrell Rinerson, Cupertino, CA (US); Steve Kuo-Ren Hsia, San Jose, CA (US); Steven W. Longcor, Mountain View, CA (US); Wayne Kinney, Emmett, ID (US); Edmond Ward, Monte Sereno, CA (US); Christophe J. Chevallier, Palo Alto, CA (US)

(73) Assignee: Unity Semiconductor Corporation

( * ) Notice: Subject to any disclaimer, the term of this patent is extended or adjusted under 35 U.S.C. 154(b) by 329 days.

(21) Appl. No.: 12/283,339

(22) Filed: Sep. 11, 2008

(65) Prior Publication Data

US 2009/0016094 A1    Jan. 15, 2009

Related U.S. Application Data

(63) Continuation of application No. 11/714,555, filed on Mar. 5, 2007, now Pat. No. 7,528,405, which is a continuation of application No. 10/605,977, filed on Nov. 11, 2003, now Pat. No. 7,186,569, which is a continuation-in-part of application No. 10/249,848, filed on May 12, 2003, now Pat. No. 6,856,536.

(60) Provisional application No. 60/400,849, filed on Aug. 2, 2002, provisional application No. 60/422,922, filed on Oct. 31, 2002.

(51) Int. Cl.
*H01L 29/06* (2006.01)
(52) U.S. Cl. .................................. 257/5; 257/E45.002
(58) Field of Classification Search .................. 257/5, 257/E45.002; 365/148
See application file for complete search history.

(56) References Cited

U.S. PATENT DOCUMENTS

| 5,160,987 | A | 11/1992 | Pricer et al. |
| 5,572,461 | A | 11/1996 | Gonzalez |
| 6,034,882 | A | 3/2000 | Johnson et al. |
| 6,130,814 | A | 10/2000 | Sun |
| 6,256,220 | B1 | 7/2001 | Kamp |
| 6,370,056 | B1 | 4/2002 | Chen et al. |
| 6,518,156 | B1 | 2/2003 | Chen et al. |
| 6,534,784 | B2 | 3/2003 | Eliasson et al. |

(Continued)

OTHER PUBLICATIONS

U.S. Appl. No. 11/881,473, Jul. 26, 2007, Brewer et al.

(Continued)

*Primary Examiner*—Mary Wilczewski
*Assistant Examiner*—Toniae M Thomas

(57) ABSTRACT

A memory cell including a memory element and a non-ohmic device (NOD) that are electrically in series with each other is disclosed. The NOD comprises a semiconductor based selection device operative to electrically isolate the memory element from a range of voltages applied across the memory cell that are not read voltages operative read stored data from the memory element or write voltages operative to write data to the memory element. The selection device may comprise a pair of diodes that are electrically in series with each other and disposed in a back-to-back configuration. The memory cell may be fabricated over a substrate (e.g., a silicon wafer) that includes active circuitry. The selection device and the semiconductor materials (e.g., poly-silicon) that form the selection device are fabricated above the substrate and are integrated with other thin film layers of material that form the memory cell.

39 Claims, 23 Drawing Sheets

U.S. PATENT DOCUMENTS

| | | | |
|---|---|---|---|
| 6,563,185 B2 | 5/2003 | Moddel et al. | |
| 6,753,561 B1 | 6/2004 | Rinerson et al. | |
| 6,756,649 B2 | 6/2004 | Moddel et al. | |
| 6,762,071 B2 | 7/2004 | Eliasson et al. | |
| 6,778,420 B2 * | 8/2004 | Parkinson | 365/100 |
| 6,784,517 B2 | 8/2004 | Kevland et al. | |
| 6,798,685 B2 | 9/2004 | Rinerson et al. | |
| 6,831,313 B2 | 12/2004 | Uchiyama et al. | |
| 6,870,755 B2 | 3/2005 | Rinerson et al. | |
| 6,972,238 B2 | 12/2005 | Hsu et al. | |
| 7,020,006 B2 | 3/2006 | Chevallier et al. | |
| 7,060,586 B2 | 6/2006 | Li et al. | |
| 7,105,852 B2 | 9/2006 | Moddel et al. | |
| 7,148,533 B2 | 12/2006 | Hsu et al. | |
| 7,173,275 B2 | 2/2007 | Estes et al. | |
| 7,218,984 B1 | 5/2007 | Bayat et al. | |
| 7,256,429 B2 | 8/2007 | Hsu et al. | |
| 7,272,067 B1 | 9/2007 | Huang et al. | |
| 7,283,403 B2 | 10/2007 | Johnson | |
| 7,319,053 B2 | 1/2008 | Subramanian et al. | |
| 7,372,753 B1 | 5/2008 | Rinerson et al. | |
| 7,379,364 B2 | 5/2008 | Siau et al. | |
| 7,388,276 B2 | 6/2008 | Estes et al. | |
| 7,408,212 B1 | 8/2008 | Luan et al. | |
| 7,417,271 B2 | 8/2008 | Genrikh et al. | |
| 7,433,222 B2 * | 10/2008 | Hosoi et al. | 365/148 |
| 7,446,010 B2 | 11/2008 | Li et al. | |
| 7,459,716 B2 | 12/2008 | Toda et al. | |
| 7,460,385 B2 | 12/2008 | Gruber et al. | |
| 7,462,857 B2 | 12/2008 | Arai et al. | |
| 7,558,099 B2 | 7/2009 | Morimoto | |
| 7,569,459 B2 | 8/2009 | Karg et al. | |
| 7,577,022 B2 | 8/2009 | Muraoka et al. | |
| 7,606,086 B2 | 10/2009 | Inoue | |
| 7,633,108 B2 | 12/2009 | Li et al. | |
| 2002/0168785 A1 | 11/2002 | Paz de Aranjo et al. | |
| 2003/0151959 A1 | 8/2003 | Tringall et al. | |
| 2004/0100817 A1 | 5/2004 | Subramanian et al. | |
| 2005/0083760 A1 | 4/2005 | Subramanian et al. | |
| 2005/0200785 A1 | 9/2005 | Jones | |
| 2006/0273301 A1 | 12/2006 | Moddel et al. | |
| 2007/0120110 A1 | 5/2007 | Estes et al. | |
| 2008/0173975 A1 | 7/2008 | Chen et al. | |
| 2008/0272363 A1 | 11/2008 | Moull | |
| 2008/0273363 A1 | 11/2008 | Moull | |
| 2009/0026434 A1 | 1/2009 | Malhotra et al. | |

OTHER PUBLICATIONS

Kwok K. Ng "Complete Guide to Semiconductor Devices" 1995, McGraw-Hill Inc., pp. 11-40; pp. 56-62; pp. 84-91; pp. 337-349.

* cited by examiner

SELECTION DEVICE FOR RE-WRITABLE MEMORY

CROSS-REFERENCE TO RELATED APPLICATIONS

This application is a continuation of application Ser. No. 11/714,555, filed Mar. 5, 2007, titled "Conductive Memory Stack With Sidewall", which is a continuation of application Ser. No. 10/605,977, filed Nov. 11, 2003, titled "Conductive Memory Stack With Sidewall", now U.S. Pat. No. 7,186,569, which is a continuation-in-part of application Ser. No. 10/249,848, filed May 12, 2003, titled "Non Volatile Memory with a Single Transistor and Resistive Memory Element", now U.S. Pat. No. 6,856,536, an application claiming the benefit of U.S. Provisional Application No. 60/400,849, filed Aug. 2, 2002 and U.S. Provisional Application No. 60/422,922, filed Oct. 31, 2002, both of which are incorporated herein by reference in their entireties and for all purposes. This application is related to the following U.S. patent applications: U.S. application Ser. No. 10/360,005, filed Feb. 7, 2003, now U.S. Pat. No. 6,917,539; U.S. application Ser. No. 10/330,512, filed Dec. 26, 2002, now U.S. Pat. No. 6,753,561; application Ser. No. 10/330,153, filed Dec. 26, 2002, now U.S. Pat. No. 6,834,008; application Ser. No. 10/330,964, filed Dec. 26, 2002, now U.S. Pat. No. 6,831,854; application Ser. No. 10/330,170, filed Dec. 26, 2002, now U.S. Pat. No. 6,970,375; application Ser. No. 10/330,900, filed Dec. 26, 2002, now U.S. Pat. No. 6,850,429; application Ser. No. 10/330,150, filed Dec. 26, 2002, now U.S. Pat. No. 6,798,685; and application Ser. No. 10/330,965, filed Dec. 26, 2002, now U.S. Pat. No. 6,850,455; all of which are hereby incorporated herein by reference in their entireties and for all purposes. This application is additionally related to the U.S. patent application Ser. No. 10/249,846, filed May 12, 2003, now U.S. Pat. No. 6,859,382, titled "Memory Array of a Non-Volatile RAM" and incorporated herein by reference in its entirety and for all purposes.

BACKGROUND OF THE INVENTION

1. Field of the Invention

The present invention relates generally to memory. More specifically, the present invention relates to selection devices for memory.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be delivered through two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in U.S. Pat. No. 6,204,139 are not generally applicable to RAM memory because the resistance of the material, when scaled to small dimensions, is considered to be too large to make a memory with fast access times.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF THE INVENTION

In one embodiment the present invention provides a conductive memory device that can be used as a fundamental element in an integrated circuit. Each conductive memory device includes a conductive top and bottom electrode, and a multi-resistive state element. The multi-resistive state element is arranged on top of and in contact with the bottom electrode and the conductive top electrode is arranged on top and in contact with the multi-resistive state element. The conductive memory device is generally operable to be reversibly placed in multiple resistive states.

A diffusion barrier, typically made of $Si_3N_4$, $TiO_2$ or $Al_2O_3$, and also acting as an etch stop during manufacturing, can be provided to surround the side surfaces of the sandwich of bottom electrode, top electrode and memory material.

The top electrode cross section can be, to reduce the effect of a leakage current conduction through a damaged outer periphery of the memory material during manufacturing, optionally made smaller than both the bottom electrode and the memory material with the cross sectional difference possibly made up by a dielectric spacer surrounding the side of the top electrode. The spacer can be made of $Si_3N_4$, $SiO_2$, $TiO_2$, $SiON$ or $Al_2O_3$. To ensure a corresponding manufacturability of the spacer, a hard mask layer can be provided atop the top electrode.

The memory material cross section can be, to remove a damaged outer periphery of the memory material during manufacturing, optionally made smaller than both the bottom electrode and the top electrode, thus defining an undercut profile.

To make an integrated circuit including these conductive memory devices, the major steps are typically providing a bottom front end of line (FEOL) section that is a partially processed wafer from a standard IC process, forming a middle memory plug section containing these conductive memory devices and forming a top metallization section.

To form a plurality of desired conductive plugs, each destined to connect the FEOL circuitry to a bottom electrode of a corresponding conductive memory device, into a first inter-layer dielectric atop the FEOL section the major steps are typically forming a plurality of contact holes through the first inter-layer dielectric, depositing a conductive plug material within the contact holes and removing excess conductive plug material atop the first inter-layer dielectric surface. As an improvement, a barrier/adhesion layer can be formed before depositing the conductive plug material.

To form the middle memory plug section the major steps are typically sputtering a bottom electrode layer, sputtering a memory material layer, sputtering a top electrode layer and photo lithographically patterning the top electrode, the memory material and the bottom electrode.

After photo lithographically patterning the top electrode, the memory material and the bottom electrode, an optional wet etching can be applied to remove a damaged outer periphery of the memory material during manufacturing, thus forming the undercut.

The process of forming the middle memory plug section can include an additional conductive hard mask layer atop the top electrode layer plus an anisotropically etchable dielectric spacer material atop the hard mask layer to form the dielectric spacer.

As an improvement, one or both of the bottom electrode and the top electrode can be made of a conductive layer and a barrier layer to prevent metal inter-diffusion.

The formation of the middle memory plug section can further include forming a second inter-layer dielectric atop an intervening etch stop/diffusion barrier.

The formation of the top metallization section can further include forming, together with a third inter-layer dielectric, one or more metallization layer with an standard processes.

In other embodiments, memory cells are arranged in a cross point array, which may have multiple layers of memory cells. In multiple-layer cross point arrays, some conductive array line layers can be commonly controlled. In yet other embodiments, the memory plugs of the cross point array may include a non-ohmic device coupled to the memory element that imparts a high resistance to the memory plug at low voltages and a low resistance to the memory plug at high voltages. Therefore, leakage current is limited at low voltages and current is able to flow at high voltages. Specifically, a low voltage might be considered to be approximately one-half of the first write voltage and approximately one-half the second write voltage. A high voltage might be the first write voltage and the second write voltage. Applying approximately one-half of the voltage to the memory plug via a first array line and applying approximately one-half of the voltage via a second array line can be used to apply a full write voltage to a particular memory cell while unselected cells are not subject to excessive current.

The present invention generally allows for non-volatile memory cell that retains information even if power ceases to be supplied to the memory cell. In one aspect, a non-volatile RAM memory array includes a plurality of memory cells formed on a semiconductor substrate, each individual cell capable of being selected with a select line and a data line. Each individual cell contains a semiconductor device and a multi-resistive state material. The semiconductor device controls current flow between the data line and the reference line depending on the voltage of the select line. Located between the data line and the reference line is the multi-resistive state material, which changes its resistive state from a high resistive state to a low resistive state upon application of a first voltage pulse across the multi-resistive state material and changes its resistive state from the low resistive state to the high resistive state upon application of a second voltage pulse across the multi-resistive state material. The second voltage pulse across the multi-resistive state material is of opposite polarity to the first voltage pulse. The resistive state of the multi-resistive state material then determines the information stored in the memory cell. In another aspect of the invention the semiconductor device is formed on a silicon substrate and two electrode layers are used. The multi-resistive state material layer is formed on the first electrode layer and the second electrode layer is formed on the multi-resistive state material, making a sandwich-like memory plug.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGS. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The present invention generally allows for multi-resistive state materials to be used as memory elements in a non-volatile RAM memory. Multi-resistive state materials generally require high temperature processing, which limits the types of material that can be used prior to the multi-resistive state material deposition. A non-volatile RAM chip that only uses materials that can withstand the high temperature processing below the multi-resistive state material is free to use regular materials above the multi-resistive state material, since those materials are not subjected to high temperature processing.

Figure 1A:
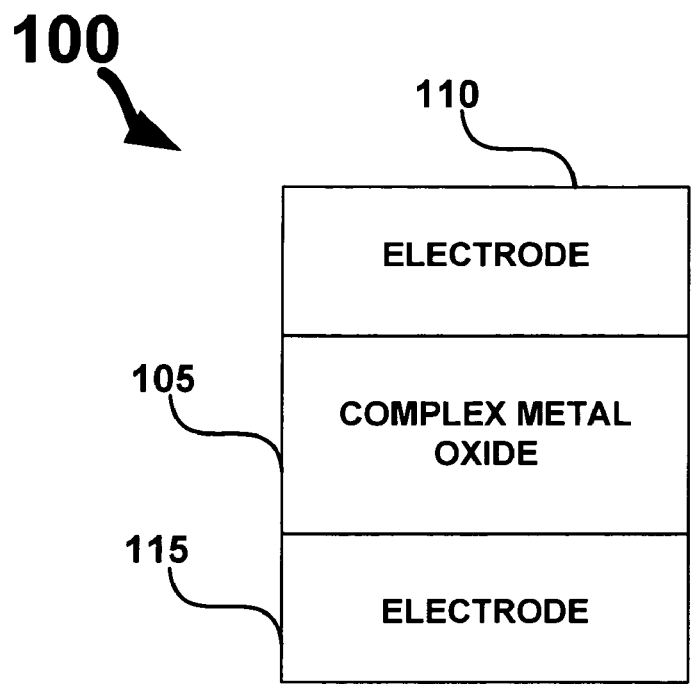
FIG. 1A depicts a block diagram of a resistive memory plug.

FIG. 1A depicts a block diagram of a resistive memory plug 100. The memory plug 100 is typically made from a thin film of multi-resistive state material 105 placed between two electrodes 110 and 115. Although the electrodes themselves 110 and 115 are essentially passive to the operation of the memory plug, the interfaces between the electrodes 110 and 115 and the multi-resistive state material 105 may contribute to the resistive properties of the memory plug 100. Electrodes 110 and 115 should have significantly less resistance than the resistance of the multi-resistive state material 105 and should be of a constant resistance so as to not directly contribute to the electrical switching properties of the memory cell. Typically, electrodes 110 and 115 would be as thin as possible while still preventing metal inter-diffusion and, if necessary, being useful as a seed layer and providing the active layer or layers. Typical electrodes 110 and 115 commonly used in fabrication include Pt, Au, Ag and Al. If the electrodes 110 and 115 are used only as a barrier to prevent metal inter-diffusion, then a thin layer of metal, e.g. TiN, could be used. If a seed layer is additionally required, any number of electrically conductive materials can be used for on top of the thin layer of metal. For example, the seed layer could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN.

It will be appreciated that the choice of electrode layers 110, 115 in combination with the multi-resistive state material layer 105 may affect the properties of the memory element. As such, the memory function is realized either by the multi-resistive state material 105 properties or by the interface between an electrode 110 or 115 and the multi-resistive state material 105. Therefore all three layers 110, 115 and 105 of the memory plug 100 can be considered as active layers. The multi-resistive state material 105 will generally be a crystalline or polycrystalline structure. One class of multi-resistive state material 105 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state material 105 for use in the memory plug 100. Multi-resistive state materials 105 are not limited to perovskites. Specifically, any material that uses trapped charges to modify or alter conductivity could be used in the memory plug 100. Doping different materials (e.g., insulators, conductors, conductive oxides, and/or polymers), for example, may create charge traps by substituting the dopant for crystalline elements. Doping may also be used to create charge traps by interstitially introducing dopants into a crystalline structure. Also, introducing separate physical clusters into a crystalline structure may additionally create charge traps. The resistance changing effect of the multi-resistive state material 105 is generally not dependent upon the area of the multi-resistive state material 105 or of its thickness. However, the resistance value is inversely proportional to the area of the thin film resistance and proportional to the thickness of the multi-resistive state material 105. Additionally, the voltage at which multi-resistive state material 105 switches resistive states is dependent upon its thickness.

The area and the thickness of the multi-resistive state material 105 as well as its resistivity will determine both the lowest possible resistance state and the highest possible resistive state. Although the highest operational resistive state ($R_0$) of the memory plug 100 does not need to be its highest possible state and the lowest operational resistance state ($R_1$) does not need to be its lowest possible state, designs can set $R_0$ and $R_1$ close to those states for simplicity. When considering an operative value of the $R_1$ resistive state parasitic resistances that are in series with the memory plug must also be considered. Sources of resistance include the contacts and the vias, the metal interconnect lines, and the driver circuits. Parasitic resistances might total 100-200$\Omega$, which puts a lower limit on the value of the memory plug resistance. While the problem can be overcome through more complicated circuit design, such designs typically result in loss of access time. Additionally, if the memory plug resistance is too high, then the $R_1$ delays in the circuit will be long, increasing the access time. Therefore, the $R_1$ state of the memory plug would have a best value of 10 k$\Omega$ to 100 k$\Omega$. However, workable values may also be achieved with resistances between 5 k$\Omega$ to 1M$\Omega$. If the $R_1$ state resistance is much less than 10 k$\Omega$, access time will be increased because of the effect of the parasitic resistances.

If the $R_1$ state value is much above 100 k$\Omega$, the RC delays will increase access time. Although very dramatic differences between a $R_1$ and $R_0$ could be sensed very easily, the voltage that drives very high resistances would be less than ideal. Since large currents can be destructive to semiconductors fabricated to small dimensions, no more than 10 μA would be desired for a memory circuit in most cases. Conversely, small differences, while workable in certain applications, result in difficulties in sensing the change in resistance and an increased access time. Typically, a single state memory would have the operational resistances of $R_0$ and $R_1$ separated by a factor of 10. For example, if 1 volt were used as a read voltage ($V_R$), $R_1$ might be about 100 k$\Omega$ and $R_0$ might be about 1 M$\Omega$, making the current either 10 μA or 1 μA, depending on the resistive state. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the multi-resistive state material 105. Similarly, $V_W$ should be greater than $V_{Wth}$ for the same reason. A typical $V_W$ might be about 2 volts, and $V_{Wth}$ might be about 1.5 volts.

However, it should be noted that changes greater than a factor of 10 might be desirable in multi-bit resistive memory cells. Generally, adjusting the pulse width and magnitude of the voltage pulses across the multi-resistive state material results in multiple resistive states. Since multi-resistive state material 105 can be placed into several different resistive states, multi-bit resistive memory cells are possible. For example, the multi-resistive state material might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 k$\Omega$, the six intermediary states might have resistive states of about 26.8 k$\Omega$, 72.0 k$\Omega$, 193 k$\Omega$, 518 k$\Omega$, 1.39 M$\Omega$, and 3.73 M$\Omega$. The highest resistive state would then be 10 M$\Omega$, 1000 times the value of the low resistive state. Each optimal resistive state could easily be calculated by using the relationship $\text{Log}(R_{110}) = \text{Log}(R_{111}) + \text{Log K}$; $\text{Log}(R_{101}) = \text{Log}(R_{111}) + 2 \text{Log K}$; $\text{Log}(R_{100}) = \text{Log}(R_{111}) + 3 \text{Log K}$; .... $\text{Log}(R_{000}) = \text{Log}(R_{111}) + 7 \text{Log K}$ where $\text{Log K} = (1/7)[\text{Log}(R_{000}) - \text{Log}(R_{111})]$.

Those skilled in the art will appreciate that the above-described voltages are voltages seen by the multi-resistive state material 105, and not necessarily the absolute values of the voltages from ground. For example, if the top electrode 110 was held to 10 volts and the bottom electrode 115 was held to 8 volts, the multi-resistive state material 105 would still attain a 2-volt drop. An opposite polarity voltage would then be attained whenever the bottom electrode 115 was held to a larger voltage than the top electrode 110. Different designs might then use different methods to create a voltage drop of opposite polarity and equal magnitude. Taking the example of the top electrode 110 being held to 10 volts and the bottom electrode 115 being held to 8 volts, one design might hold the top electrode 110 to the same 10 and change only the voltage on the bottom electrode 115 to 12 volts in order to attain a voltage drop of opposite polarity and equal magnitude. An alternative design might reverse the voltages on the electrodes, holding the bottom electrode 115 to 10 volts and the top electrode 110 to 8 volts so that neither electrode would experience a change in voltage of more than 2 volts.

Ideally, the multi-resistive state material 105 should switch very quickly from one resistive state to another. For current applications, anything less than 50 nanoseconds would be an appropriate switching speed. Additionally, once the multi-resistive state material 105 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multi-resistive state material 105. Generally, the chemical and materials properties of the multi-resistive state material 105 are selected to meet the electrical specifications set forth above. For example, the material preferably has a resistivity of not greater than about 1 $\Omega$-cm (although 5 $\Omega$-cm may be a workable value), exhibits a change in resistance of at least about 10×, and has this resistance change triggered by the application of a voltage pulse of not longer than about 100 ns duration and not greater than about than 10V in magnitude. In addition, the memory element material should be compatible with the requirements imposed by the general fabrication process of the entire high density RAM. Of course, there is some flexibility in the process constraints. Thus, process and design engineers will have certain ranges of chemical, materials, and process parameters available to tailor for the specific goals at hand. Among these parameters are the annealing conditions, the deposition temperature and method, and the material stoichiometry and the thickness.

To allow rapid access times (on the order of tens of nanoseconds) in small dimension devices (on the order of hundreds of nanometers), the memory element material resistivity should be optimized. The resistivity of the multi-resistive state materials depends upon various factors, often including some of the following: film thickness, oxygen content of the film, stoichiometry, elemental composition, deposition method and conditions, degree of crystallinity, crystallite size, crystalline orientation, and doping level and choice of dopant. Current research indicates that suitably low resistivity multi-resistive state material materials can be achieved by judicious choice of these parameters. One example of a suitable film thickness for the memory applications of this invention is approximately 500 Å to 3000 Å. Thinner films sometimes have higher strains, usually resulting from a slight misalignment with the seed layer, which can result in higher resistivity. Film thickness has been discussed by S. I. Khartsev, et al. in "Colossal magnetoresistance in ultrathin epitaxial $\text{La}_{0.75}\text{Sr}_{0.25}\text{MnO}_3$ films," Journal of Applied Physics, Vol. 87, No. 5, 1 Mar. 2000, which is hereby incorporated by reference for all purposes. Another factor that affects resistivity is the oxygen content of the film. By properly controlling the exposure to oxygen during deposition and annealing (if any) the resistivity can be controlled. It has been observed that 1500 Å lanthanum manganese oxide (LMO) films deposited by pulsed laser deposition in oxygen environments have a lower resistivity than films deposited in vacuum (but otherwise identical conditions). See Y. G. Zhao, et al., "Effect of oxygen content on the structural, transport, and magnetic properties of $\text{La}_{1-\delta}\text{Mn}_{1-\delta}\text{O}_3$ thin films," Journal of Applied Physics, Vol. 86, No. 11, 1 Dec. 1999, which is hereby incorporated by reference for all purposes. Cooling down the freshly deposited film in an oxygen-containing atmosphere further decreases film resistivity. It has been further observed that adjusting the relative amounts of the rare earths and the alkaline earth metals can modify resistivity. Higher ratios of alkaline earth to rare earth metals can, to a degree (e.g., up to about 50:50 in lanthanum calcium manganese oxides), lower resistivity. See Guo-Qiang Gong, et al., "Colossal magnetoresistance of 1000000-fold magnitude achieved in the antiferromagnetic phase of $La_{1-x}Ca_xMnO_3$," Applied Physics Letters, Vol. 67, No. 12, 18 Sep. 1995, which is hereby incorporated by reference for all purposes. Further, it has been found that some polycrystalline materials may have lower resistivities than their amorphous and single crystal counterparts. It has also been observed that magnitude of the resistance changes in single crystal multi-resistive state material films exceeds that of the polycrystalline films. Large changes (i.e., greater than about 10×), are, however, not typically necessary for making a practical memory chip.

In light of the above, some specific multi-resistive state material materials suitable for use with this invention will have the following properties: (1) the thickness of the deposited multi-resistive state material film is between 500 Å and 3000 Å; (2) the deposition and cool down and post deposition annealing (if any) is performed in an oxygen rich ambient; (3) the ratio of the rare earth and alkaline earth metals is adjusted for lowest resistivity, e.g., about 0.5; (4) the material is deposited or annealed to give a polycrystalline structure; (5) the material is deposited or annealed to increase the percentage of crystallites in a preferred orientation; and (6) the multi-resistive state material is doped with a material that has the effect of pinning the oxygen vacancies, and/or introducing trapping sites within the material, and/or altering the resistivity of the material. In addition to the above properties, certain process and design features are important. First, the seed layer or other "substrate" on which the multi-resistive state material deposits impacts the resistivity of the multi-resistive state material and other properties. Often the underlying crystallographic orientation of the substrate will epitaxially propagate to the upper levels the multi-resistive state material element. So, for example, if the underlying substrate has a 100 orientation, then the multi-resistive state material may preferentially deposit in a 100 orientation. Preferably, the underlying substrate is a conductive electrode such a noble metal (e.g., platinum) or relatively conductive multi-resistive state material such as $LaNiO_3$. In polycrystalline structures, suitable crystallite sizes may range from about 100 Å to about 500 Å. The general process operations for creating a multi-resistive state material memory plug include (1) providing a substrate on which to directly form the memory plug, (2) depositing the memory plug material on the substrate, and optionally (3) post-processing the deposited material to impart a desired property. As indicated above, the substrate material should be polycrystalline or single crystalline, be conductive, and serve as an electrode. Various physical vapor deposition (PVD) and chemical vapor deposition (CVD) techniques may be employed. Many forms of PVD and CVD can be employed, assuming that they operate at temperatures compatible with the overall device fabrication technology. Post-processing operations must also meet the temperature strictures of the technology. Often, this means that the deposition process should operate at temperatures below 600° C.

Figure 1B:
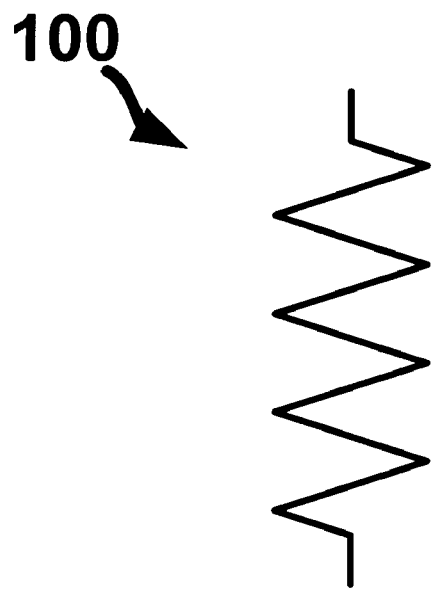
FIG. 1B depicts a schematic representation of the memory plug of FIG. 1A.

FIG. 1B is a schematic representation of the memory plug 100. To make a practical memory cell using a resistive memory plug 100, some type of semiconductor device should be placed in series with the resistive element 100.

The Memory Array

Conventional nonvolatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized. U.S. patent application, "Cross Point Memory Array Using Multiple Thin Films," U.S. application Ser. No. 10/330,512, filed Dec. 26, 2002, now U.S. Pat. No. 6,753,561, incorporated herein by reference in its entirety and for all purposes, describes such a device.

Figure 1C:
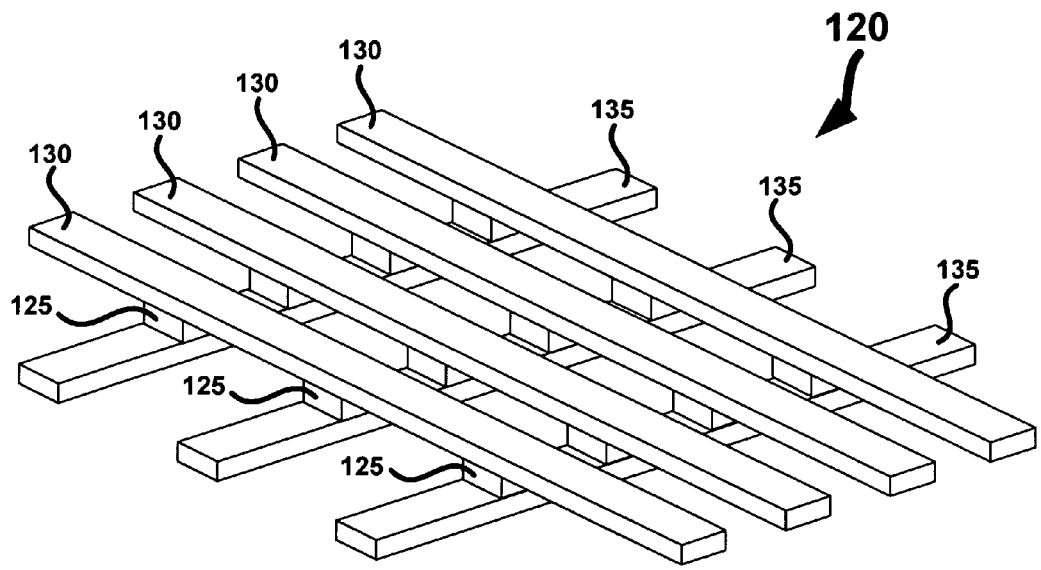
FIG. 1C depicts a perspective view of an exemplary cross point memory array employing a single layer of memory.

FIG. 1C depicts a perspective view of an exemplary cross point memory array 120 employing a single layer of memory. A bottom layer of x-direction conductive array lines 135 is orthogonal to a top layer of y-direction conductive array lines 130. The x-direction conductive array lines 135 act as a first terminal and the y-direction conductive array lines 130 act as a second terminal to a plurality of memory plugs 125, which are located at the intersections of the conductive array lines 135 and 130. The conductive array lines 135 and 130 are used to both deliver a voltage pulse to the memory plugs 125 and carry current through the memory plugs 125 in order to determine their resistive states.

Conductive array line layers 135 and 130 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2:
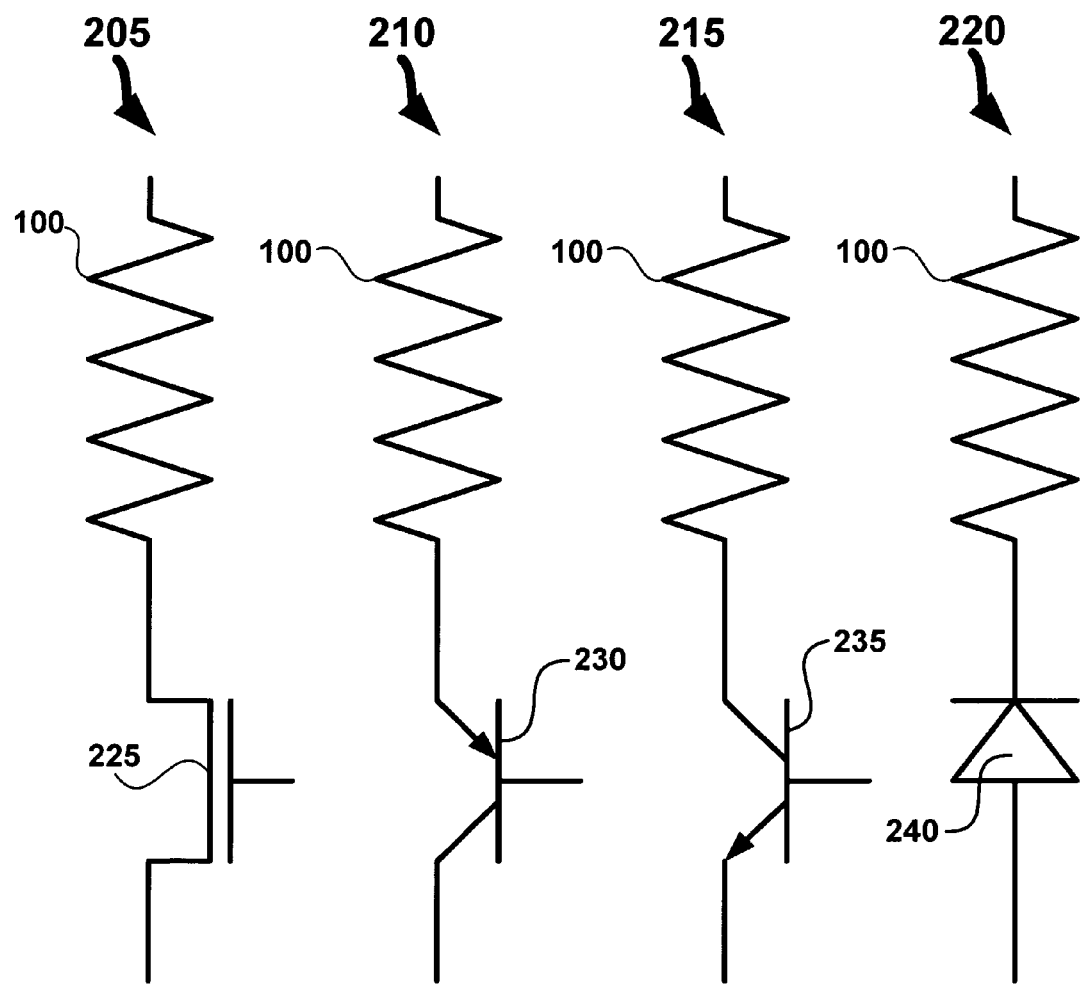
FIG. 2 depicts a schematic representation of various memory cells using a semiconductor device and the memory plug of FIG. 1B.

FIG. 2 is a schematic representation of various memory cells 205, 210, 215, and 220 using the memory plug 100. The memory cells 205, 210, 215, and 220 all use a semiconductor device in order to control access to the memory plug 100. Possible devices include a FET 225, a pnp transistor 230, a npn transistor 235, and a diode 240. Other devices, such as a parasitic vertical bipolar transistor that consists of a p junction and an N well in a p substrate, may also be used.

Figure 2A:
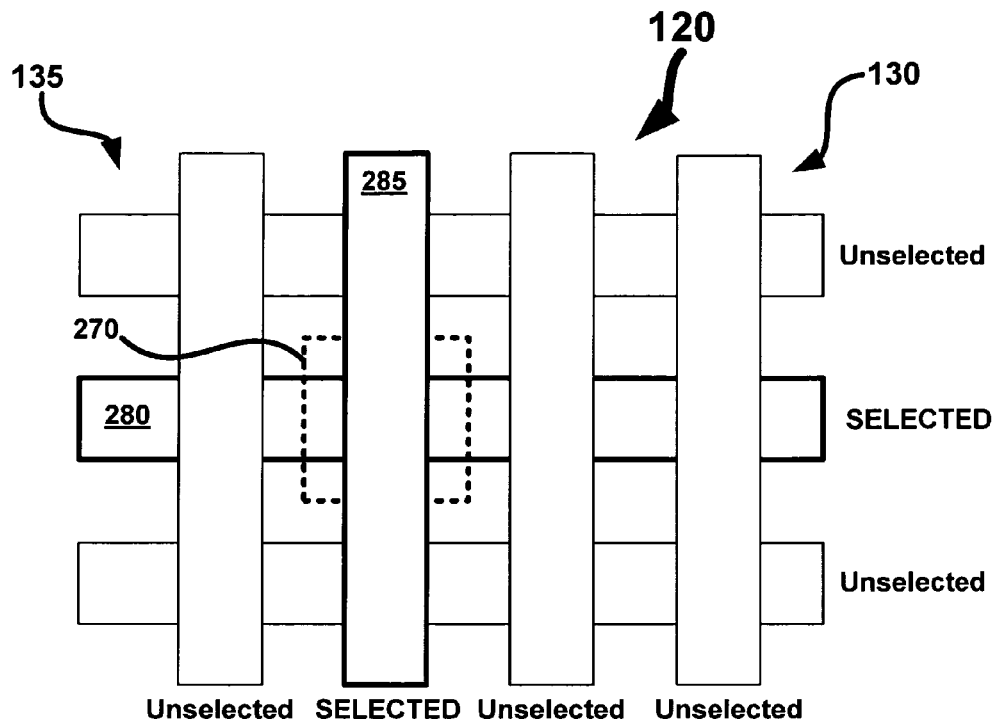
FIG. 2A depicts a plan view of selection of a memory cell in the cross point array depicted in FIG. 1C.
Figure 2B:
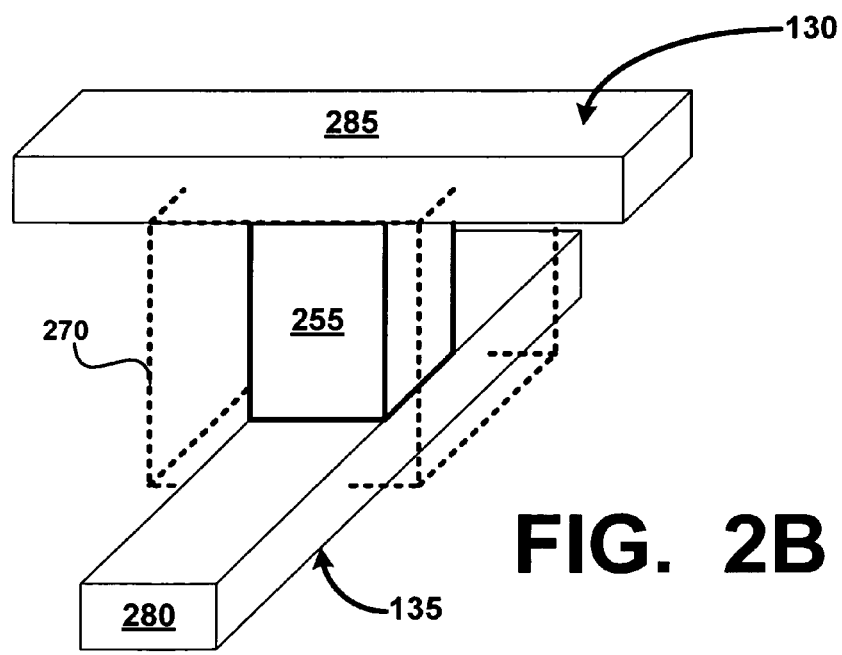
FIG. 2B depicts a perspective view of the boundaries of the selected memory cell depicted in FIG. 2A.

FIG. 2A illustrates selection of a memory cell 270 in the cross point array 100. The point of intersection between a single x-direction conductive array line 280 and a single y-direction conductive array line 285 uniquely identifies the single memory cell 270. FIG. 2B illustrates the boundaries of the selected memory cell 270. The memory cell 270 is a repeatable unit that can be theoretically extended in one, two or even three dimensions. One method of repeating the memory cells 270 in the z-direction (orthogonal to the x-y plane) is to use both the bottom and top surfaces of conductive array lines 135 and 130.

Figure 1D:
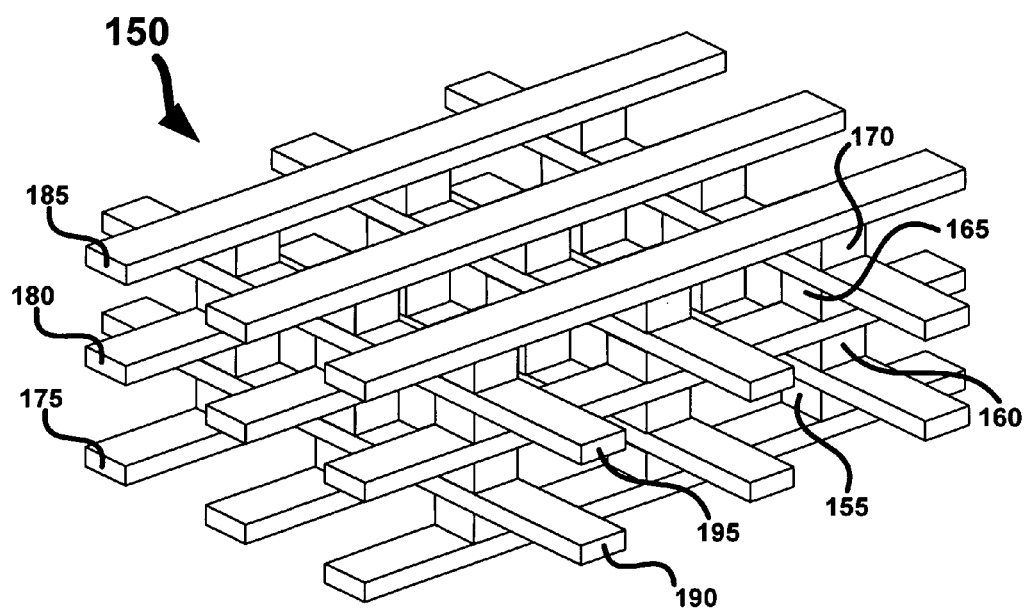
FIG. 1D depicts a perspective view of an exemplary stacked cross point memory array employing four layers of memory.

FIG. 1D depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170. U.S. patent application, "Re-Writable Memory With Multiple Memory Layers," U.S. application Ser. No. 10/612,191, filed Jul. 1, 2003, now U.S. Pat. No. 6,906,939, incorporated herein by reference in its entirety for all purposes, describes stacked cross point arrays.

Referring back to FIG. 2B, the repeatable cell 270 that makes up the cross point array 120 can be considered to be a memory plug 255, plus ½ of the space around the memory plug 255, plus ½ of an x-direction conductive array line 280 and ½ of a y-direction conductive array line 285. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 120 or 150 can be placed beneath the cross point array, therefore reducing the footprint required on a semiconductor substrate. U.S. patent application, "Layout Of Driver Sets In A Cross Point Memory Array," U.S. application Ser. No. 10/612,733, filed Jul. 1, 2003, now U.S. Pat. No. 7,079,442, incorporated herein by reference in its entirety for all purposes, describes various circuitry that can achieve a small footprint underneath both a single layer cross point array 120 and a stacked cross point array 150.

The cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3A:
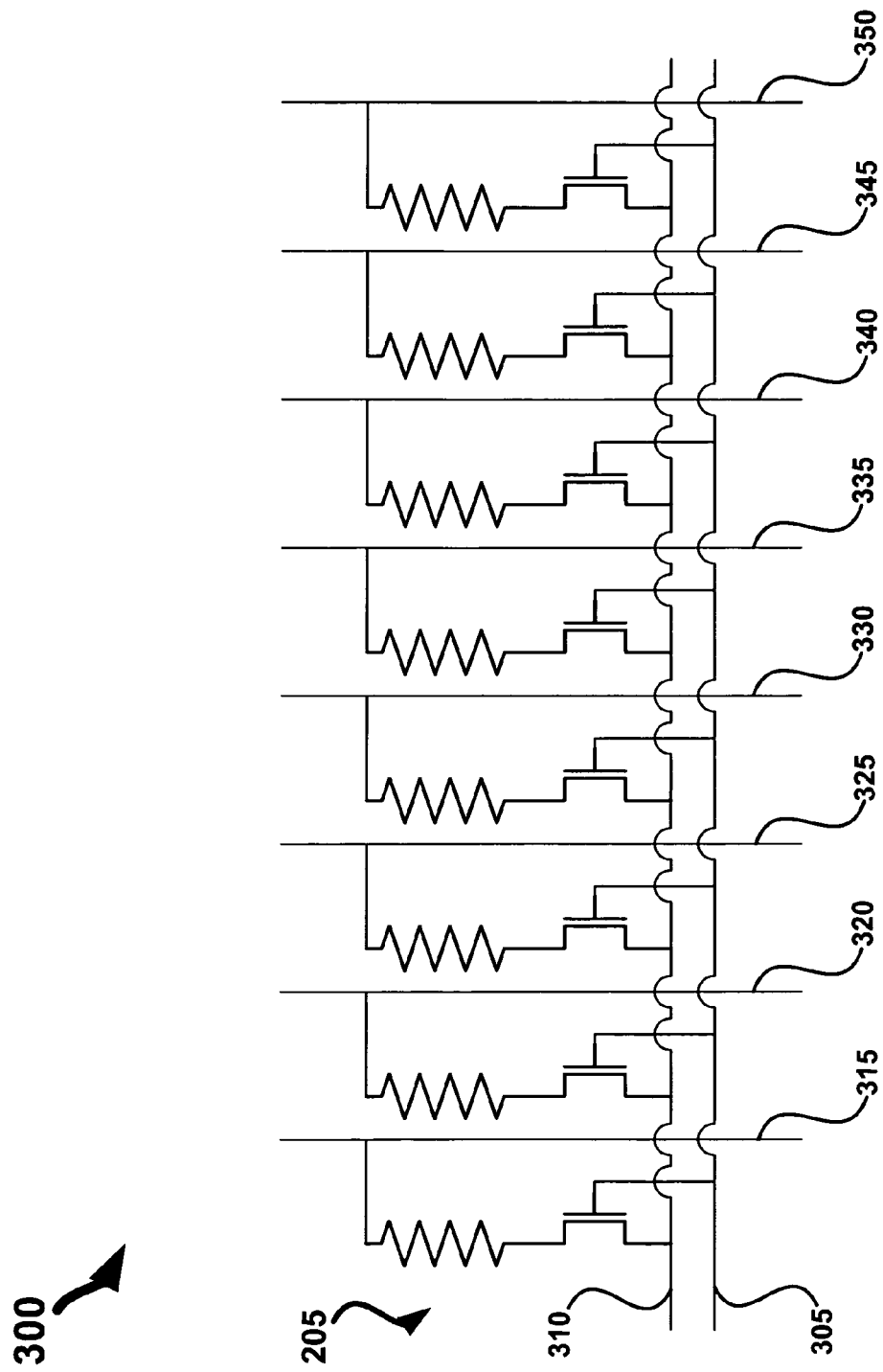
FIG. 3A depicts a schematic representation of a row of memory cells using a FET device, as shown in FIG. 2.

FIG. 3A is a schematic representation of an array 300 of memory cells 205. Each memory cell 205 in the array is connected to a select line 305, a reference line 310 and a plurality of data lines 315, 320, 325, 330, 335, 340, 345, and 350. Activating the FET 225 requires a gate voltage that is above the threshold voltage of the FET 225. The select line 305, therefore, is used to activate all the FETs in a particular row of memory cells. The data lines 315, 320, 325, 330, 335, 340, 345, and 350 both carry the data from the memory cells during READ operation and provides the memory cells with a voltage pulse appropriate to change the resistive state of the memory plug 100 during a WRITE operation. Selection circuitry can be used to select a specific data line 315, 320, 325, 330, 335, 340, 345 or 350 so that only the desired memory cells are accessed. The reference line 310 provides a reference voltage to all the memory cells. The reference voltage is typically either ground (0V) or a constant supply voltage. In the case where more than one cell (e.g., 205 and 355) is selected at a time, and where one select line 305 is active and more than one data line (e.g., 315 and 350) is active, the resulting current from all the active data lines 315 and 350 would go through the cells 205 and 355 to the common reference line 310. This may be too much current for a single reference line 310, and may result in a voltage drop due to the parasitic resistance, especially in a large array. It could also affect the reliability of the reference line 310 due to electromigration induced by too much current in the line. Techniques that address this issue are discussed in connection with FIG. 4.

Figure 3B:
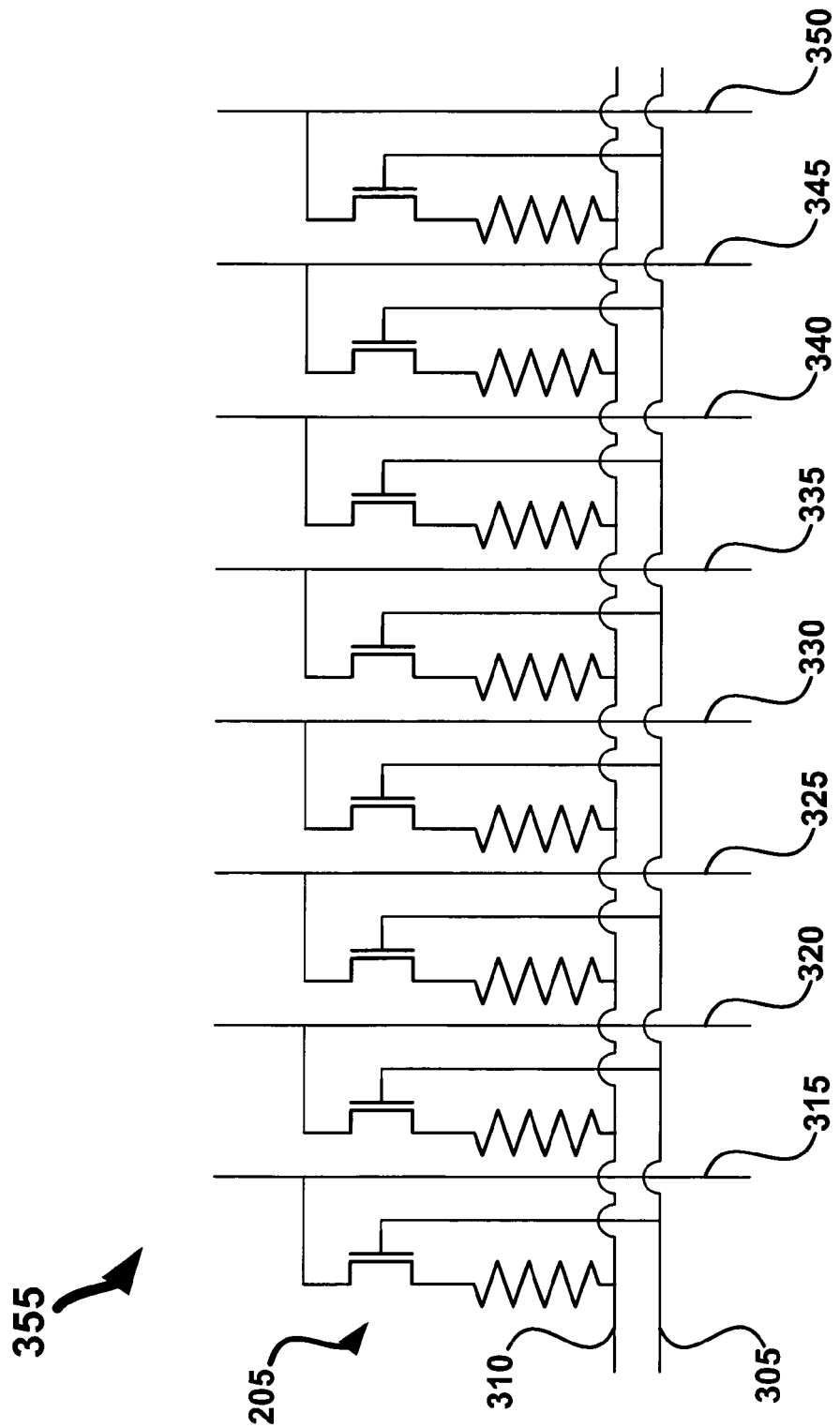
FIG. 3B depicts a schematic representation of a row of memory cells using an alternate arrangement than that of FIG. 3A.

The array 300 of FIG. 3A is subject to numerous modifications. For example, FIG. 3B is a schematic representation of an array 360 that has the memory cells flipped upside down so that the memory plug 100 is connected with the reference line 310 and the FET 225 is connected to the select line 305 and the appropriate data line 315. In both configurations the transistor 225 is able to prevent the memory plug 100 from experiencing a voltage drop between the data line 315 and the reference line 310. However, the array 300 of FIG. 3A would still cause the memory plug 100 to experience voltage changes associated with the changing data line 315, but no voltage drop. In contrast, memory plug 100 in the configuration of FIG. 3B is subjected to the constant voltage of the reference line 310 for as long as the transistor 225 is not activated.

Figure 3C:
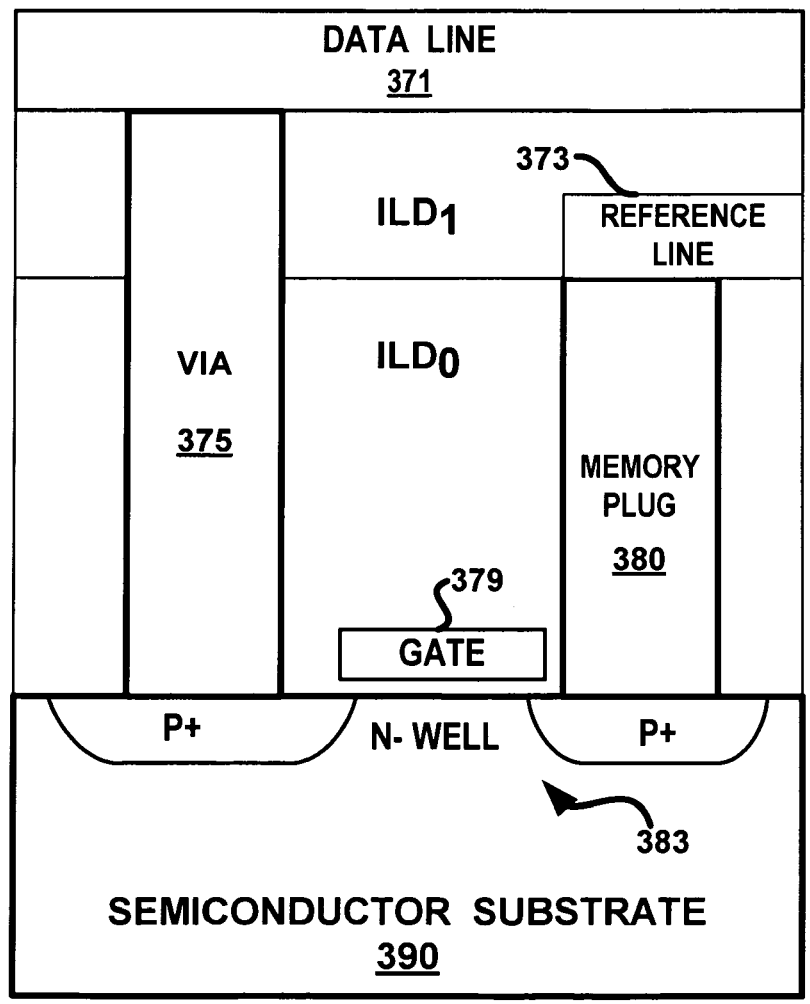
FIG. 3C depicts a generalized representation of a memory cell that can be used in a transistor memory array.

FIG. 3C is a generalized diagrammatic representation of a memory cell 370 that can be used in a transistor memory array. Each memory cell 370 includes a transistor 383 and a memory plug 380. The transistor 383 is used to permit current from the data line 371 to access the memory plug 380 when an appropriate voltage is applied to the select line 379, which is also the transistor's gate. The reference line 373 might span two cells if the adjacent cells are laid out as the mirror images of each other. U.S. patent application, "Non-Volatile Memory with a Single Transistor and Resistive Memory Element," U.S. application Ser. No. 10/249,848, filed May 12, 2003, now U.S. Pat. No. 6,856,536, incorporated herein by reference in its entirety for all purposes, describes the specific details of designing and fabricating a transistor memory array.

The Memory Plug

Each memory plug 255 or 380 contains a multi-resistive state element (described later) along with any other materials that may be desirable for fabrication or functionality. For example, the additional materials might include a non-ohmic device, as is described in U.S. patent application "High Density NVRAM," U.S. application Ser. No. 10/360,005, filed Feb. 7, 2003, now U.S. Pat. No. 6,917,539, incorporated herein by reference in its entirety for all purposes. The non-ohmic device exhibits a very high resistance regime for a certain range of voltages ($V_{NO-}$ to $V_{NO+}$) and a very low resistance regime for voltages above and below that range. The non-ohmic device, either alone or in combination with other elements, may cause the memory plug 255 or 380 to exhibit a non-linear resistive characteristic. Exemplary non-ohmic devices include three-film metal-insulator-metal (MIM) structures and back-to-back diodes in series. In FIG. 2B, the memory cells 270 include a memory plug 255 and a mechanism, such as conductive array lines (e.g., 280 and 285), that deliver current to the memory plug 255.

Figure 2C:
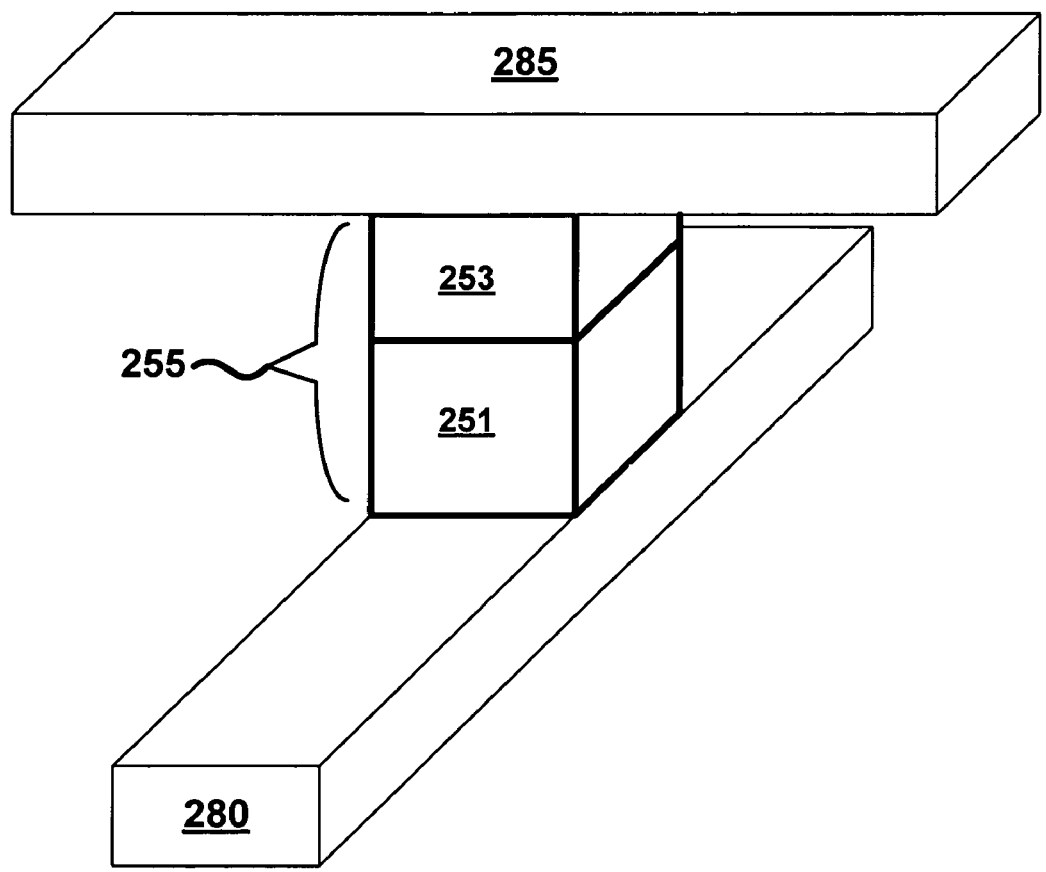
FIG. 2C depicts a perspective view of a memory plug including a memory element and a non-ohmic device that are electrically in series with each other.

Turning now to FIG. 2C, the principal components of the memory plug 255 include (a) a memory element 251, (b) a non-ohmic device 253 for modifying the current-voltage characteristics of the memory element 251, and optionally (c) other components that may be necessary in certain embodiments to address materials and fabrication considerations. Most fundamentally, the memory plug 255 should include two or more resistance states that can be distinguished during a read operation. These states should be reversible by application of a stimulus such as an electric field of specified size and polarity. Further the states should not be easily disturbed. Thus, the resistance of the material as a function of the stimulus should exhibit hysteresis.

The memory elements 251 impart the distinct resistance states. Memory elements 251 with three or more distinct resistance states allow multi-bit memory plugs 255 (also referred to as multi-level memory plugs 255), which will be discussed later. The present discussion will focus on two-state memory plugs 255 that store a single bit of information. Also, for consistency throughout this document, the lower resistance state of the memory plug 255 will be referred to as providing a value of 1 and the higher resistant state will be referred to as providing a value of 0.

When the stimulus driving state change is voltage, the memory element 251 switches between one resistance state and another by application of at least a threshold write voltage (deemed $V_{Wth}$ herein). To change resistance states in one direction (e.g., from 1 to 0), a write voltage $V_W$ is applied. To change states in the opposite direction, a write voltage of the opposite polarity ($-V_W$) is applied. The magnitude of $V_W$ must be greater than $V_{Wth}$.

The non-ohmic device 253 imparts a very high resistance at low applied voltages (and a low resistance at high voltages), which prevents the unselected plugs 255 from being disturbed during normal read and write operations and minimizes unwanted power dissipation during such operations. Preferably, the memory plugs 255 are accessed via conductive lines of a cross point array, although many other configurations appropriate for particular applications.

Figure 2D:
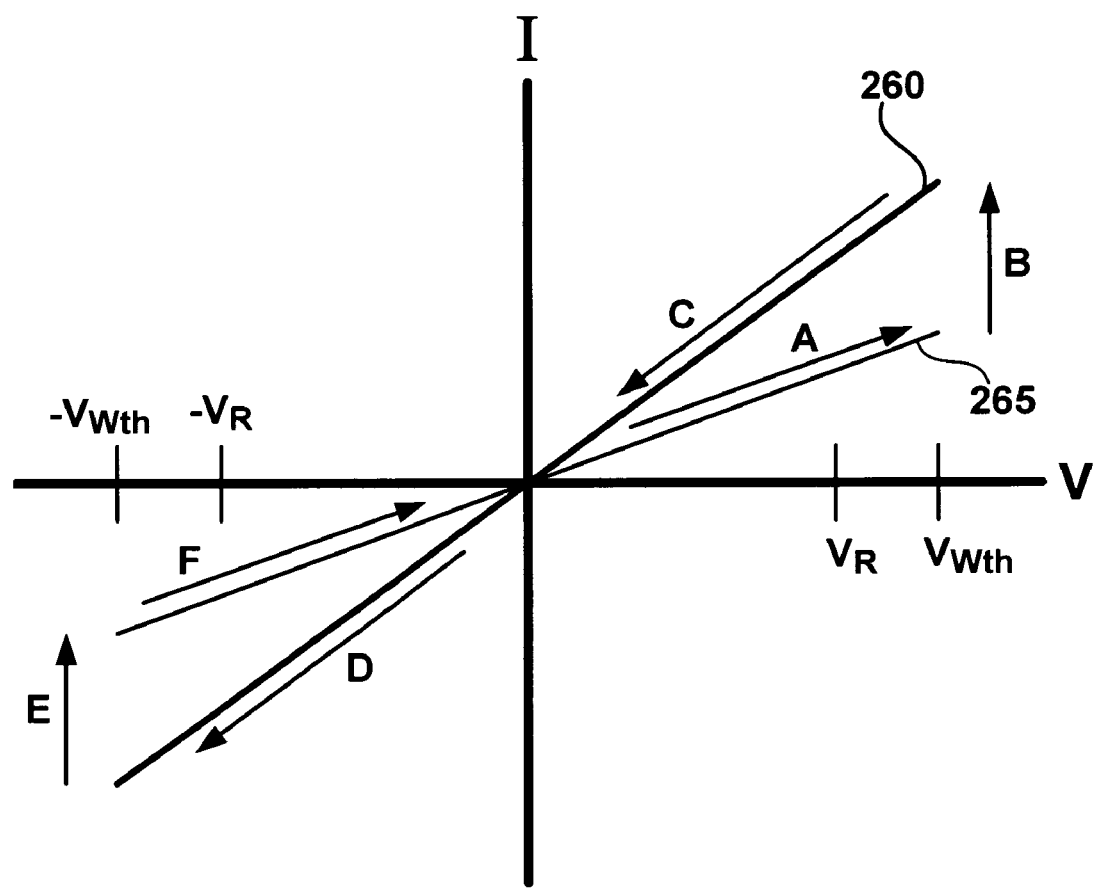
FIG. 2D is a graph depicting the basic current-voltage characteristics of a two-state (single bit) resistive memory element suitable for use in memory plugs.

FIG. 2D depicts the basic current-voltage characteristics of a two-state (single bit) resistive memory element 251 suitable for use in memory plugs 255 of this invention. A high resistance state is illustrated by a I-V line 265 and a low resistance state is illustrated by a I-V line 260. If the memory element 251 is initially in the high resistance state 265, and a voltage pulse of either positive or negative polarity is applied, the memory element 251 will transition into the low resistive state 260. Afterwards, a voltage pulse of an opposite polarity from the initialization voltage pulse will return the memory element 251 to the high resistance state 265.

The I-V characteristics depicted in FIG. 2D may be acceptable for some applications, but there are two issues that encourage a modified I-V characteristic for other applications. First, to minimize disruption of unselected plugs 255 on a selected line during read and write operations, it may be desirable to have a very high resistance at voltages near zero. Additionally, to minimize current dissipation during normal operation, the same characteristic is desirable. In some designs, unselected plugs 255 on a selected line are exposed to a fractional voltage, such as one-half the voltage required to read or write from the selected plug. Ideally, this fractional voltage will be in a region of the I-V profile where minimal current is drawn. To this end, the memory plug 255 employs a non-ohmic device 253. The non-ohmic device 253 preferably has a high resistance when exposed to the fractional voltages and a low resistance when exposed to the full read or write voltages. Since read and write voltages are both positive and negative, the non-ohmic device 253 is preferably, though not necessarily, symmetric and not uni-directional.

In the half select embodiment, an x-direction conductive array line receives the fractional voltage of one-half the read voltage or one-half the write voltage during read and write cycles, respectively. Similarly, the corresponding y-direction array line receives one-half the read voltage or one-half the write voltage. That way, only the selected plug 255 at the x-y intersection sees the full value read or write voltage, while other plugs 255 on each line see only one-half the read or write voltage. When coupled with an appropriate I-V resistance characteristic, disruption to unselected plugs 255 and unwanted current dissipation is minimized. The half select feature will be described in more detail below.

As indicated, a preferred memory array for use with the memory plugs 255 of this invention is a cross point array.

Generally, a cross point array is a memory array of orthogonal conductive array lines intersecting at memory plugs. The memory plug footprints correspond closely to the perimeters defined by intersecting conductive array lines. Thus, memory plugs in a cross point array should be small. To this end, the memory plugs 255 employed in certain embodiments of this invention do not employ access transistors or similar active components. Cross point array designs suitable for use with this invention will be described in more detail below.

Figure 2E:
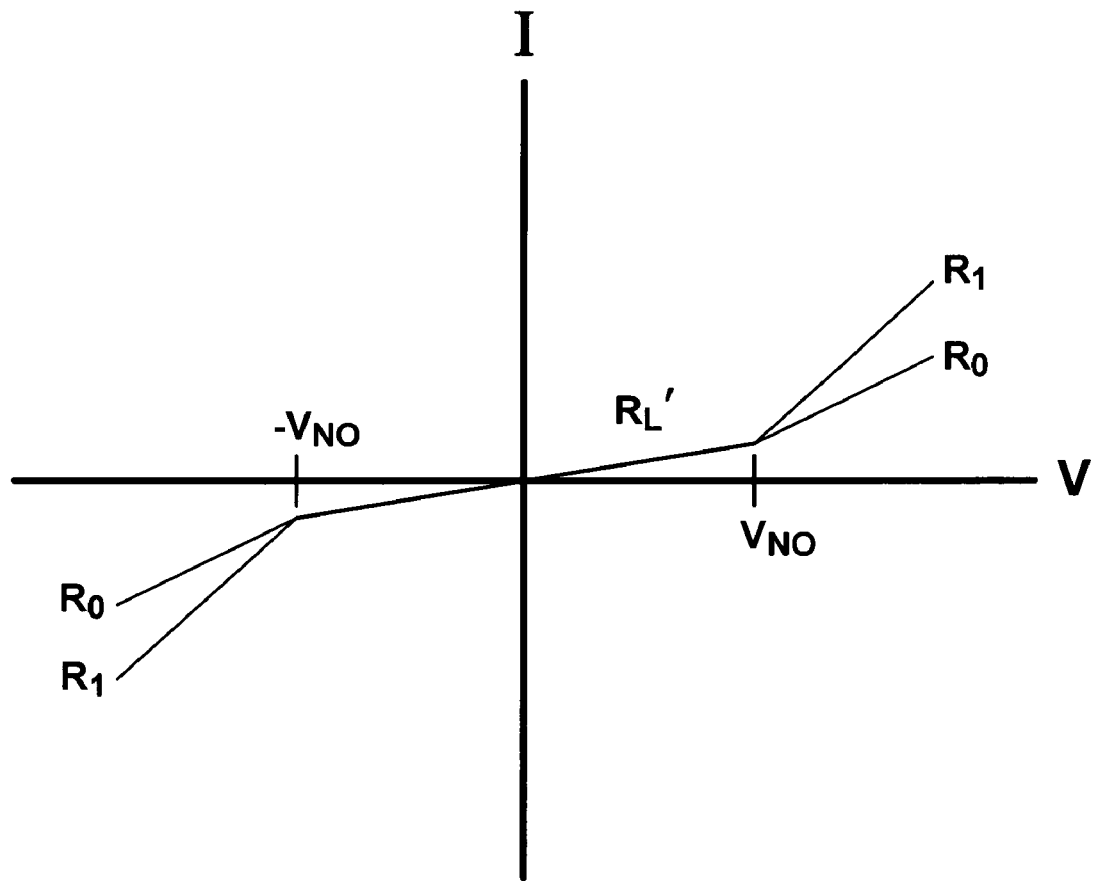
FIG. 2E is a graph depicting an example of preferred I-V characteristics for a memory plug.

An example of a preferred I-V characteristics for a memory plug of this invention is depicted in FIG. 2E. Note that the plug 255 may include a memory element 251 that has the I-V characteristics depicted in FIG. 2D and a non-ohmic device 253 that has the I-V characteristics depicted in FIG. 2F. When such components are coupled (e.g., 251 and 253 in FIG. 2C), the overall memory plug 255 has the I-V characteristics depicted in FIG. 2E.

Figure 2F:
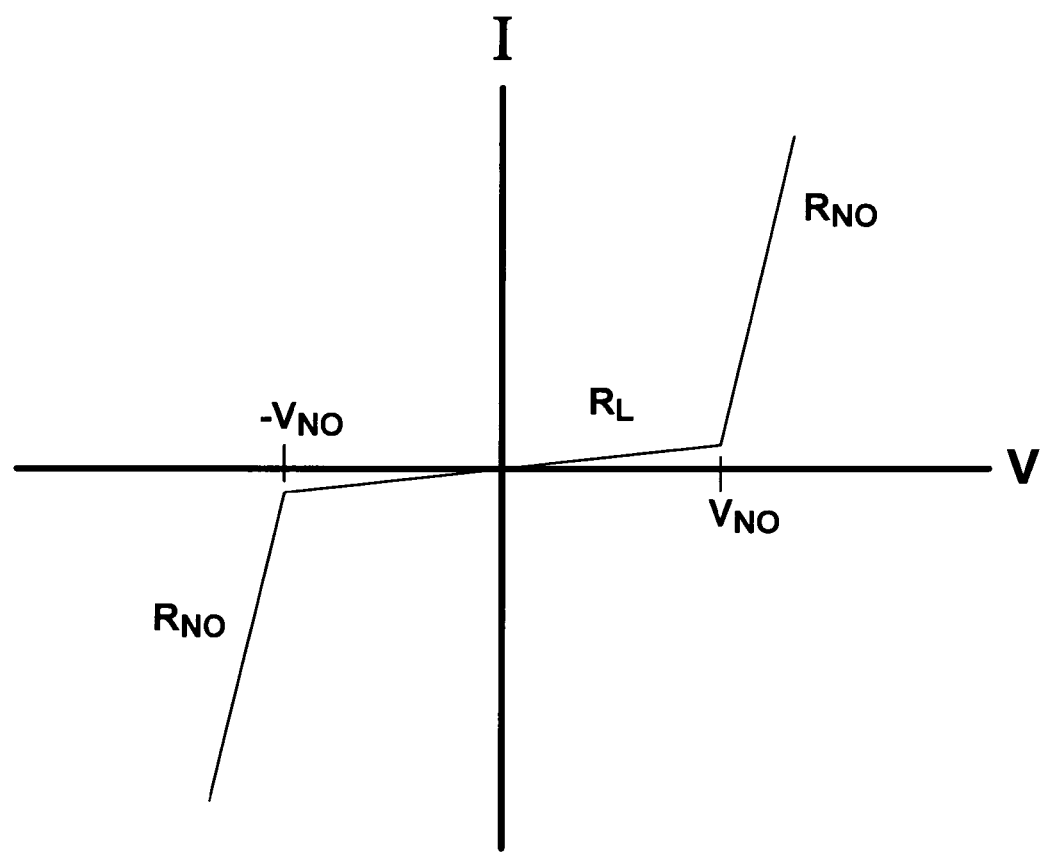
FIG. 2F is a graph depicting an example of preferred I-V characteristics for a non-ohmic device.

As depicted in FIGS. 2E and 2F, the memory plug 255 has a very high resistance regime near zero volts. This regime resides between voltages $-V_{NO}$ and $V_{NO}$, and has a resistance designated $R_L$ (see FIG. 2F). Beyond these voltages, the circuit component depicted in FIG. 2F goes to a very low resistance state labeled $R_{NO}$.

When a non-ohmic circuit element 253 having the I-V characteristics depicted in FIG. 2F is connected in series with a memory element 251 having the I-V characteristics depicted in FIG. 2D, a memory plug 255 having the characteristics depicted in FIG. 2E results. As shown in FIG. 2E, the memory plug 255 maintains a high resistance of $R_L'$ (about equal to $R_L$) in the voltage domain between $-V_{NO}$ and $V_{NO}$. Beyond this domain (in both the negative and positive voltage domains), the resistance of the memory plug 255 splits into two states $R_1$ and $R_0$ as depicted.

Figure 2G:
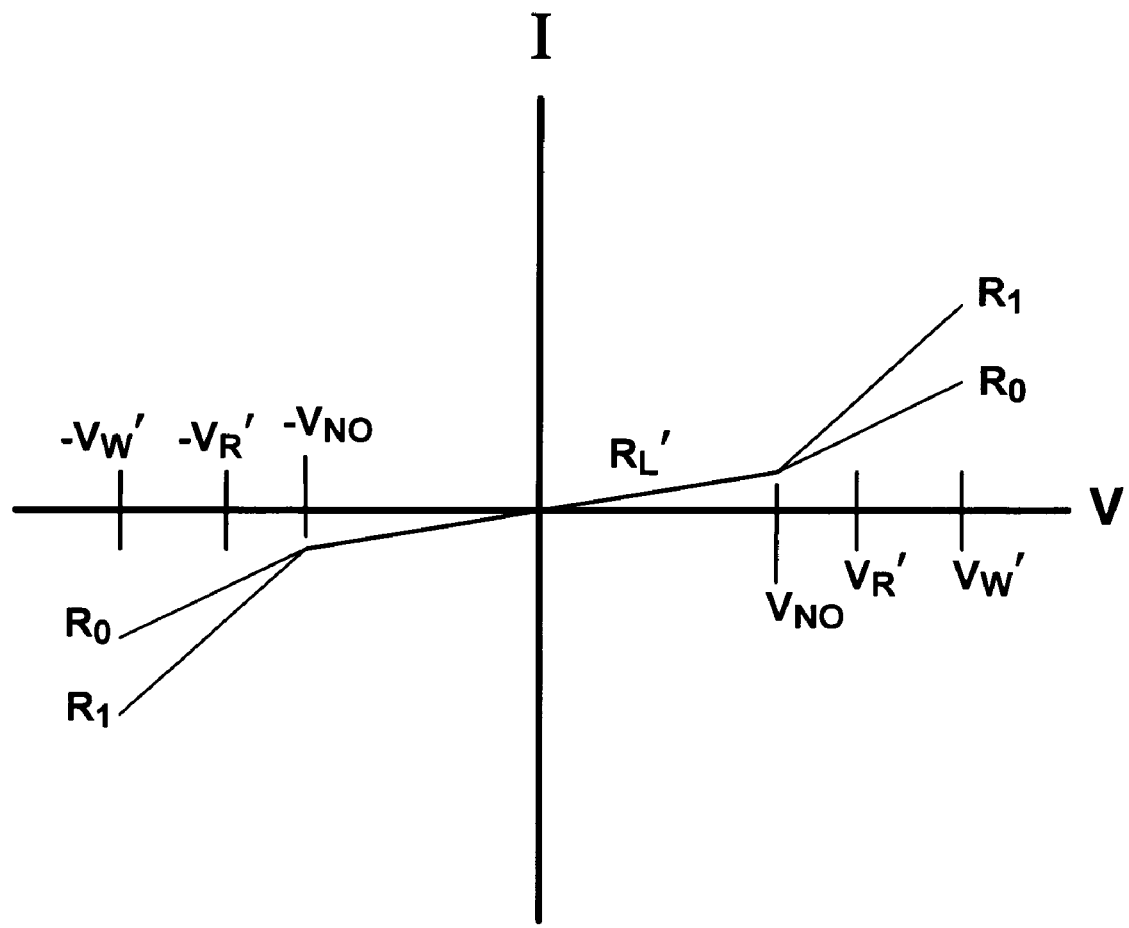
FIG. 2G is a graph depicting an example of preferred I-V characteristics superimposed with the indicators of read and write voltages.

FIG. 2G depicts the I-V characteristics shown in FIG. 2E superimposed with the indicators of read and write voltages. To understand this figure, recognize that there are two characteristic read voltages and two characteristic write voltages associated with the memory plug 255. One of these is for the simple memory element 251 itself as depicted in FIG. 2D. The other is for the overall plug 255, including the memory element 251 and the non-ohmic device 253. As defined before, the write voltage $V_W$ and the read voltage $V_R$ are the voltages seen by the memory element of the memory plug. If the memory plug 255 includes additional circuitry possessing the I-V characteristics depicted in FIG. 2F, for example, then an additional read and write voltage must be defined: one that is seen by the entire memory plug 255, not just the memory element 251 of that plug 255. The magnitudes of these whole-plug read and write voltages (denoted $V_R'$ and $V_W'$) are equal to the required read and write voltages of the memory element 251 in combination with the additional voltage needed to compensate for the non-ohmic device 253 (and any other additional elements that provide a voltage drop).

As depicted in FIG. 2G, in a preferred implementation, a value of $V_R'$ resides a relatively small distance on the voltage scale to the positive side of $V_{NO}$, past where the two resistance states ($R_1$ and $R_0$) branch apart. Similarly, $-V_R'$ resides a relatively small distance to the negative side of $-V_{NO}$ on the voltage scale. Further, the voltages $V_W'$ and $-V_W'$ reside somewhat beyond the magnitudes of $V_R'$ and $-V_R'$ on the voltage scale. Note that the plug 255 will also have characteristic threshold write voltages $V_{Wth}'$ and $-V_{Wth}'$, not shown, at which the resistance actually changes state. $V_W'$ will always greater than or equal to $V_{Wth}'$.

To read from a memory plug having the I-V characteristics of FIG. 2G, one preferably applies a voltage of $V_R'$ (or $-V_R'$) across the memory plug 255. Similarly, to write to such memory plug 255, one applies a voltage of $V_W'$ (or $-V_W'$) across the memory plug 255. As indicated, a high-density NVRAM employing peripheral circuitry that applies one-half of the read or write voltage via one array line and one-half of the read or write voltage (of opposite polarity) an orthogonal array line is ideally suited for use with memory plugs 255 that have the I-V characteristics depicted in FIG. 2G.

The memory plug I-V parameters of interest include $R_1$ and $R_0$ (the resistances of the memory plug 255 when the memory element 251 is in its low state or its high state), $V_W$ and $V_R$ (the write and read voltages experienced by the memory element), $V_W'$ and $V_R'$ (the write and read voltages experienced by the whole memory plug 255), $V_{NO}$ (the voltage at which the memory plug 255 transitions from a very high resistance state to two distinctly separate resistance states ($R_1$ and $R_0$)), $R_L$ (the resistance associated with the range between $-V_{NO}$ and $V_{NO}$ for the non-ohmic device 253 as depicted in FIG. 2F), $R_L'$ (the resistance associated with the range between $-V_{NO}$ and $V_{NO}$ across the entire plug), and $R_{NO}$ (the resistance of the non-ohmic circuit element 253 at voltage magnitudes beyond $V_{NO}$).

Some fairly straightforward design constraints allow one to implement a working memory plug 255. For example, if about 1000 Å of a memory element material were used, then $V_{Wth}$ would be about 2V for the memory element 251. If a maximum current of 10 μA were desired, and the resistive states of the memory element 251 were desired to be an order of magnitude apart, then a $V_R$ of 1V might cause a particular memory element 251 to exhibit a low resistive state of 100 kΩ and a high resistive state of 1MΩ. A $V_R$ of 1V would also be far enough from $V_{Wth}$ to prevent a read from disturbing the memory element 251.

For the above example, assuming there are not any other additional elements that provide a voltage drop, $V_{NO}$ would need to be at least 2V to realize the full benefits of the non-ohmic circuit element 253 during a half-select write (the minimum $V_{NO}$ can be calculated from $V_{NO}=\frac{1}{2}V_W'=\frac{1}{2}(V_{NO}+V_W)=V_W$). A $V_{NO}$ of 2V would cause $V_W'$ to be 4V and $V_R'$ to be 3V. However, a higher $V_{NO}$ might be appropriate to allow for some fabrication inconsistencies and other additional elements in the memory plug 255 that provide a voltage drop. If the CMOS fabrication process is then restricted to having no more than ±3V on the memory device, then the maximum $V_W'$ would be 6V. Therefore, if 1000 Å of a memory element required 2V to change its resistive state, a maximum current of 10 μA was desired, and a read operation could detect a 10× change from one resistive states to the next, $V_W'$ would be chosen to be between 4V and 6V, $V_R'$ to be between 3V and 5V and $V_{NO}$ to be between 2V and 4V.

The actual physical structure of a memory plug 255 may take many different forms. In a preferred embodiment, it minimally includes a layer of the material comprising the memory element 251 sandwiched between two separate conductive array lines. Preferably, the memory plug 255 will also include a non-ohmic device 253 located with the memory element 251, between the two array lines (see 280 and 285 in FIG. 2C). As mentioned, such non-ohmic device 253 preferably provides the I-V characteristics depicted in FIG. 2F.

FIG. 2C depicts one example of a memory plug 255 structure in a cross point array. A first conductive array line 280 and a second conductive array line 285 serve as contacts for the memory plug 255. In other embodiments, separate contacts or electrodes may be provided within the memory plug 255. These could be conductive barrier layers, seed layers, etc. that electrically contact conductive array lines 280 and 285. In the example depicted in FIG. 2C, no such separate contacts are depicted. In this example, a memory element 251 sits directly on lower conductive array line 280. A non-ohmic circuit device 253 is sandwiched between resistive memory element 251 and upper array line 285. FIGS. 2A and 2B depict a memory cell 270, the unit that is repeated in the memory array 100.

The structure depicted in FIG. 2C may be an idealized or simplified embodiment. Typically, one or more barrier layers and/or seed layers may be required depending upon the fabrication process and the materials comprising the memory element 251, the non-ohmic device 253 and the array lines (280, 285). In addition, the non-ohmic device 253 may be a multi-layered structure having a degree of complexity commensurate with the requirements of the circuit element 253.

As indicated, the non-ohmic device 253 should have I-V characteristics at least approximating those shown in FIG. 2F. Various circuit components meet this requirement. In one embodiment, the element 253 is a combination of two oppositely oriented diodes connected in series. When two diodes are oppositely oriented, one diode's forward current is blocked by the other diode at low voltages (e.g., voltages between $-V_{NO}$ and $V_{NO}$). But at the breakdown voltage of each diode, the resistance to current flow diminishes greatly. Hence, in this embodiment, it is the diodes' breakdown voltages that define $V_{NO}$ and $-V_{NO}$. Some well known diodes are (i) a PN junction diode, in amorphous, microcrystalline, polycrystalline or single crystal semiconductor (e.g. Si, Ge, SiGe, GaAs, InP, etc.); (ii) a metal-semiconductor Schottky diode; (iii) a junction field-effect transistor with gate connected to source (or to drain); (iv) a MOSFET with gate either floating, or connected to source or connected to drain; (v) a Zener diode, avalanche diode, or tunnel diode; (vi) a four-layer diode (SCR); (vii) a P-I-N diode in amorphous, microcrystalline, polycrystalline or single crystal semiconductor; and others that will be readily apparent to those skilled in the art. Another implementation of the non-ohmic device 253 comprises two oppositely oriented diodes connected in parallel. Yet another implementation comprises a metal-insulator-metal (MIM) tunneling device.

A preferred embodiment of the non-ohmic element 253 would be constructed from the same material as the memory element 251. Both the non-ohmic element 253 and the memory element 251 could then be contained in a single layer of the memory plug 255.

The material comprising the memory element 251 should most fundamentally have I-V characteristics at least approximating those shown in FIG. 2D. Various types of material meet this requirement. Many of these also exhibit colossal magnetoresistive effects. While not wishing to be bound by theory, it is believed that these various effects may derive from the same underlying physical phenomena in some materials.

$Pr_{0.7}Ca_{0.3}MnO_3$, $La_{0.7}Ca_{0.3}MnO_3$, $Gd_{0.7}Ca_{0.3}BaCO_2O_5$, $SrZrO_3$, and $SrTiO_3$ are specific examples of complex metal oxides that exhibit the desired reversible multi-resistance. In addition to being complex metal oxides, some of these materials have a perovskite crystal structure. Note that the resistive memory components employed in this invention are not limited to either complex metal oxide or perovskite crystal lattice structure. Any material approximating the I-V characteristics described above or meeting other requirements described elsewhere herein may be suitable for use as a memory element 251 of this invention.

Furthermore, as described in "Rewriteable Memory With Non-Linear Memory Element," U.S. application Ser. No. 10/604,556, filed Jul. 30, 2003, now U.S. Pat. No. 6,870,755, incorporated herein by reference in its entirety for all purposes, it may also be possible for the memory cell exhibit non-linear characteristics without a separate non-ohmic device. It should be noted that since it is possible for a memory cell to exhibit non-linear characteristics the terms "resistive memory" and "resistive device" also apply to memories and devices showing non-linear characteristics, and can also be referred to as "conductive memory" and "conductive device." While a non-ohmic device might be desirable in certain arrays, it may not be helpful in other arrays.

Electrodes will typically be desirable components of the memory plugs 255 or 380, a pair of electrodes sandwiching the multi-resistive state element. If the only purpose of the electrodes is as a barrier to prevent metal inter-diffusion, then a thin layer of metal, e.g. TiN, Pt, Au, Ag and Al. could be used. However, conductive oxide electrodes may provide advantages beyond simply acting as a metal inter-diffusion barrier. U.S. patent application, "Conductive Memory Device With Barrier Electrodes," U.S. application Ser. No. 10/682,277, filed Oct. 8, 2003, now U.S. Pat. No. 7,067,862, incorporated herein by reference in its entirety for all purposes, describes electrodes (formed either with a single layer or multiple layers) that prevent the diffusion of metals, oxygen, hydrogen and water, act as a seed layer in order to form a good lattice match with the conductive memory element, include adhesion layers, and reduce stress caused by uneven coefficients of thermal expansion, and provide other benefits. Additionally, the choice of electrode layers in combination with the multi-resistive state element layer may affect the properties of the memory plug 255 or 380, as is described in U.S. patent application, "Resistive Memory Device With A Treated Interface," U.S. application Ser. No. 10/665,882, filed Sep. 19, 2003, now U.S. Pat. No. 7,326,979, incorporated herein by reference in its entirety for all purposes. The multi-resistive state element will generally, but not necessarily, be crystalline, either as a single crystalline structure or a polycrystalline structure. One class of multi-resistive state element are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr), other materials such as $Ca_2Nb_2O_7$:Cr, and $Ta_2O_5$:Cr, and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state element for use in the memory plug 255 or 380. The compounds that make up the perovskite class of multi-resistive state elements include both simple conductive metal oxides and complex conductive metal oxides. Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, the terms "conductive memory" and "conductive device" can include devices that are fabricated with materials that are classified as insulators, but are thin enough to allow tunneling conduction.

Multi-resistive state elements, however, are not limited to perovskites. Specifically, any material that has a hysteresis that exhibits a resistive state change upon application of a voltage while allowing non-destructive reads is a good candidate for a multi-resistive state element. A non-destructive read means that the read operation has no effect on the resistive state of the memory element. Measuring the resistance of a memory cell is accomplished by detecting either current after the memory cell is held to a known voltage, or voltage after a known current flows through the memory cell. Therefore, a multi-resistive state material that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. The same principle applies if more that one resistive state is used to store information (e.g., the multi-resistive state element has a high resistive state of $R_{00}$, a medium-high resistive state of $R_{01}$, a medium-low resistive state of $R_{10}$ and a low resistive state of $R_{11}$).

As described in U.S. patent application, "A 2-Terminal Trapped Charge Memory device with Voltage Switchable Multi-Level Resistance," U.S. application Ser. No. 10/634,636, filed Aug. 4, 2003, now U.S. Pat. No. 7,038,935, incorporated herein by reference in its entirety for all purposes, trapped charges are one mechanism by which the hysteresis effect is created. Trapped charges can be encouraged with dopants, as described in U.S. patent application, "Multi-Resistive State Material that Uses Dopants," U.S. application Ser. No. 10/604,606, filed Aug. 4, 2003, now U.S. Pat. No. 7,071,008, incorporated herein by reference in its entirety for all purposes.

It should be appreciated that fabrication of the multi-resistive state element might include additional techniques in order to ensure an effective memory device. For example, biasing the multi-resistive state element might be required in order to ensure the hysteresis is presented in a certain direction. U.S. patent application, "Multi-Layer Conductive Memory Device," U.S. application Ser. No. 10/605,757, filed Oct. 23, 2003, now U.S. Pat. No. 6,965,935, incorporated herein by reference in its entirety for all purposes describes using a multi-layered multi-resistive state element in order to encourage a hysteresis in a certain direction.

The fabrication techniques used for the memory plug 255 or 380 will typically dictate the requirements of the layers beneath the memory plug (e.g., in a transistor memory array the select line 379; and in a cross point array 120 or 150 the driver circuitry and conductive lines 135, 175, 180, 190 and 195). Since certain fabrication processes (e.g., solution based spin on followed by high temperature anneal, pulsed laser deposition, sputtering, and metal-organic chemical vapor deposition) might require high temperatures, refractory metals should be used for these layers so that they may withstand the temperatures. However, refractory metals have higher resistances, which may limit the number of cells on an array. U.S. patent applications, "Laser Annealing of Complex Metal Oxides (CMO) Memory Materials for Non-Volatile Memory Integrated Circuits," U.S. application Ser. No. 10/387,799, now U.S. Pat. No. 7,309,616, and "Low Temperature Deposition of Complex Metal Oxides (CMO) Memory Materials for Non-Volatile Memory Integrated Circuits," U.S. application Ser. No. 10/387,773, now U.S. Pat. No. 7,063,984, both filed Mar. 13, 2003, and both incorporated herein by reference in their entireties for all purposes, describe fabrication techniques that may be able to be used in lieu of high temperature fabrication processes.

Figure 4:
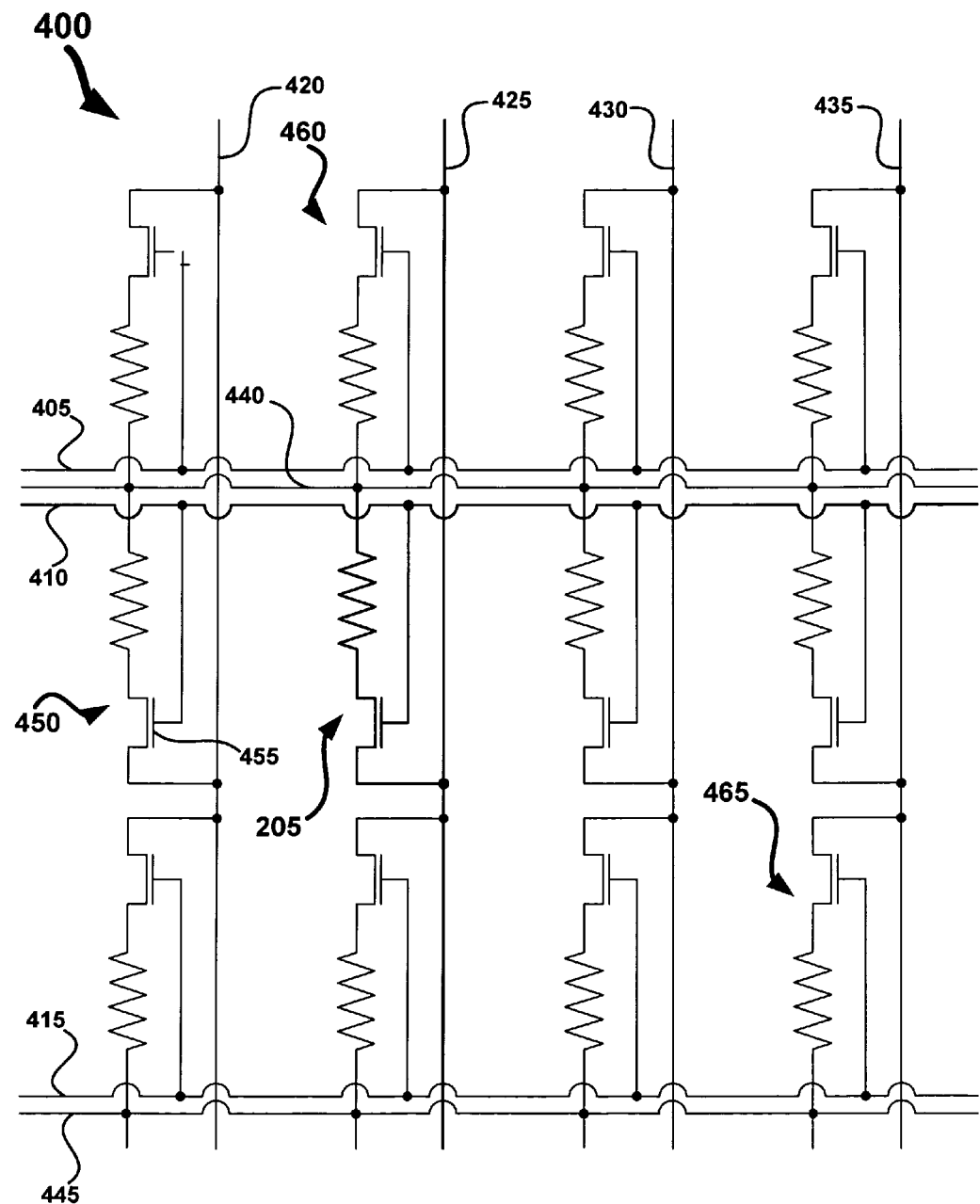
FIG. 4 depicts a schematic representation of an array of memory cells using the row arrangement of FIG. 3B.

Similarly, FIG. 4 is a schematic representation of an array 400 of memory cells laid out in a repeatable pattern in two dimensions. Although there are multiple select lines 405, 410, and 415, and data lines 420, 425, 430, and 435, each individual memory cell 205 can be uniquely defined by a single select line 410 and a single data line 425. Table 1 shows the operational voltages that could be applied to the array 400 in one possible embodiment of the invention.

TABLE 1

|  | Selected Data Line | Unselected Data Line | Selected Select Line | Unselected Select Line | Reference Line |
|---|---|---|---|---|---|
| READ | 1 V | Floating | 3 V | −2 V | 0 V |
| WRITE 1 | −2 V | Floating | 3 V | −2 V | 0 V |
| WRITE 0 | 2 V | Floating | 3 V | −2 V | 0 V |

In the embodiment of Table 1, the reference lines 440 and 445 stay grounded. As previously described, activating more than one cell at a time may lead to voltage drops due to parasitic resistances. One technique that can be used to avoid this problem is to tie all the reference lines (e.g., 440 and 445) together at regular intervals. For example, including a line parallel to the data lines every 64 cells might ameliorate any unwanted voltage drops. Regardless of the technique used, it would generally be desirable to keep the reference line at a constant voltage. During the READ operation, the selected memory plug 100 experiences a voltage drop of $V_R'$ ($V_R'$ is $V_R$ plus all other incidental voltage drops of the memory cell, such as from the electrodes 110 and 115 and the FET 225). It should be noted that current also flows through the unselected memory plugs along the selected select line 410. An unselected memory plug 450 along the selected select line 410 would have its n-channel FET 455 active, allowing current to flow. However, since the decoding circuitry only reads information off of the selected data line 425, the current that flows through the unselected data lines 420, 430, and 435 is not relevant to determining the stored value in the selected memory cell 205. The voltage of the floating unselected data lines 420, 430, and 435 must not, however, exceed $|V_{Wth}'|$ ($V_{Wth}'$ is $V_{Wth}$ plus all other incidental voltage drops, such as from the electrodes 110 and 115) or else the floating voltages may alter the resistive states in the unselected memory cells. Alternatively, the unselected data lines 420, 430, and 435 might be held to some voltage in between $V_{Wth}'$ and $-V_{Wth}'$ (such as the reference voltage) if parasitic capacitance or some other correction mechanism was not thought to be sufficient to prevent the voltage from floating too high or too low. Current does not flow through the other unselected memory plugs because their n-channel FETs do not have a gate voltage greater than the required threshold gate voltages. An unselected memory cell 460 along the selected data line 425 would have a gate voltage of −2V, which is lower than both the voltage of the selected data line 425, which is 1V, and the reference voltage, which is 0V. Of course, any value of 0V or less could be used for the unselected select lines 405 and 415 during the READ operation. As will be appreciated, the −2V value is simply used for convenience. Similarly, an unselected memory plug 465 along an unselected data line 435 and an unselected select line 415 would have a gate voltage of −2V, which is lower than both the unselected data line, which cannot float to less than −2V, and the reference voltage, which is 0V. The WRITE 1 operation puts the memory plug 100 into the $R_1$ state. This can either be done only after a read to ensure that the memory plug 100 is not already in the $R_1$ state, or it can be done without a read if $R_1$ is the highest possible state. Similarly, the WRITE 0 operation puts the memory plug 100 into the $R_0$ state, which is typically the lowest possible resistive state of the memory plug 100. The unselected memory cells are not affected by either WRITE operation either because their gates are not activated or the unselected data lines only float between voltages of $V_{Wth}'$ and $-V_{Wth}'$. To generate internal write voltages, two on chip voltage converters will convert the chip power supply, typically 3V or 1.8V, to the required value. One voltage converter, for example, could produce a 2V signal, and the other might produce a −2V signal.

Figure 5:
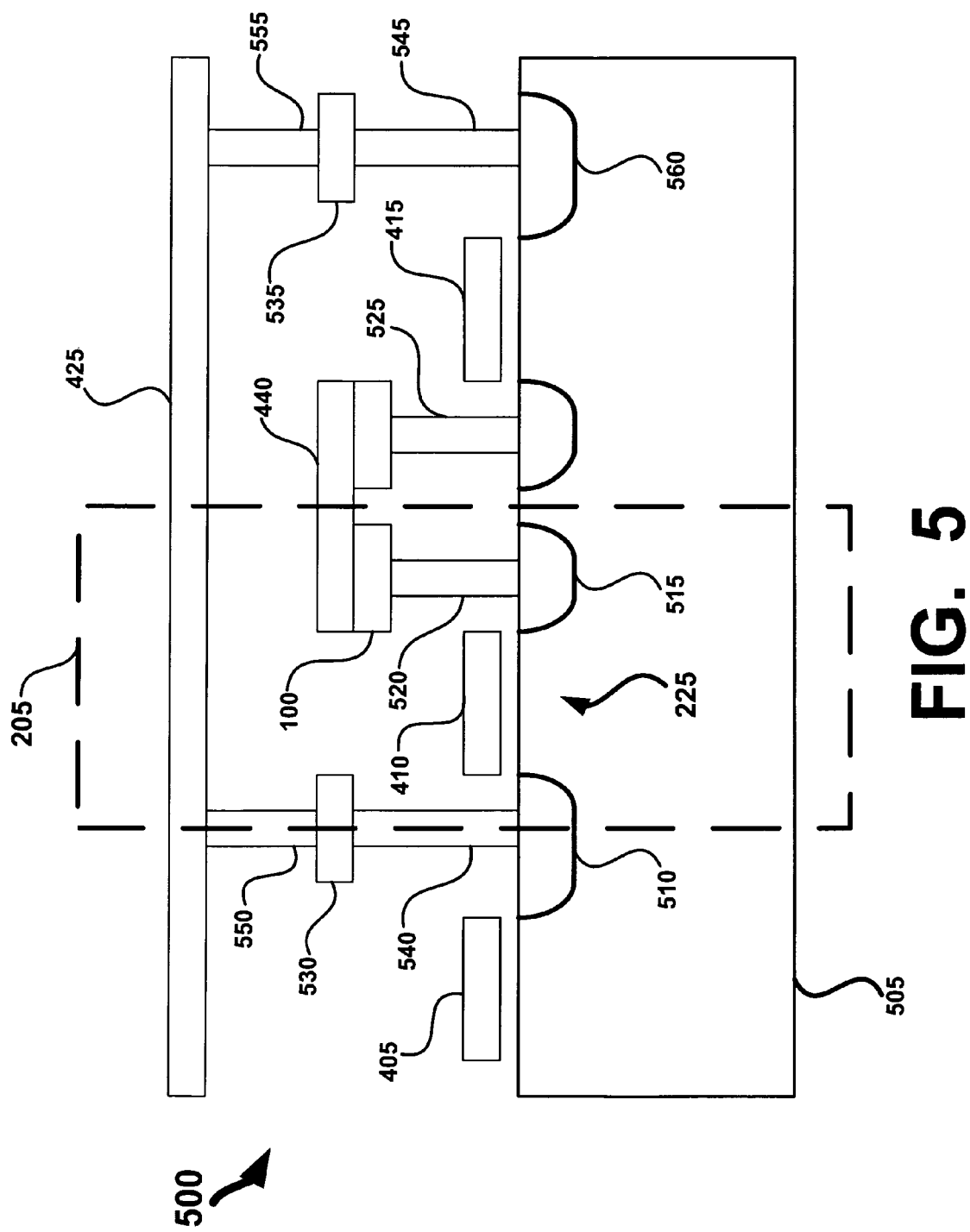
FIG. 5 depicts a cross sectional diagram of a portion of the memory chip that implements the schematic layout of FIG. 4.

FIG. 5 is a cross sectional diagram of a portion of the memory chip 500 that implements the schematic layout of FIG. 4. Three layers are used on top of the silicon wafer 505: one for the select lines 405, 410, and 415; one for the reference line 440; and one for the data line 425. The select lines 405, 410, and 415 can be polysilicon or possibly silicide to provide a direct gate voltages for the n-channel FETs, allowing current to flow through two p-type junctions 510 and 515 when activated. Polysilicon and silicide have resistances of 3 to 30Ω/□ where copper metal lines typically have resistances of less than 0.1Ω/□. Therefore, certain embodiments may have the chip be much longer in the data line-direction than the select line-direction. As previously discussed, the multi-resistive state material layer 105 may require very high temperatures to form the required polycrystalline or a single crystalline structure. Depending upon the fabrication process (e.g., solution based spin on followed by high temperature anneal, pulsed laser deposition, sputtering, and metalorganic chemical vapor deposition) the fabrication temperature might require that substances such as polysilicon, silicide, and/or refractory metals be used for the layers that are formed below the memory plug 100, such as the select lines 405, 410, and 415 and some vias 520 and 525. As long as no high temperature processes are required after the multi-resistive state material layer 105 is deposited, a more standard conductive metal (e.g., copper) can be used for the layers that come after the multi-resistive state material layer 105, such as the reference line 440, metal plugs 530 and 535, vias 540, 545, 550, and 555, and the data line 425. The metal plugs 530 and 535 are used to connect the vias 540 and 545 that are formed below the reference line 440 metalization layer and the vias 550 and 555 that are formed above the reference line 440 metalization layer so that the data line 425 is connected to the ep junctions 510 and 560.

Methods of Manufacture

FIGS. 6-10 describe one possible technique that can be used to fabricate the cell 205, using specific materials. It should be understood that the described materials, processes and thicknesses are not the only embodiment that can be used.

Figure 6:
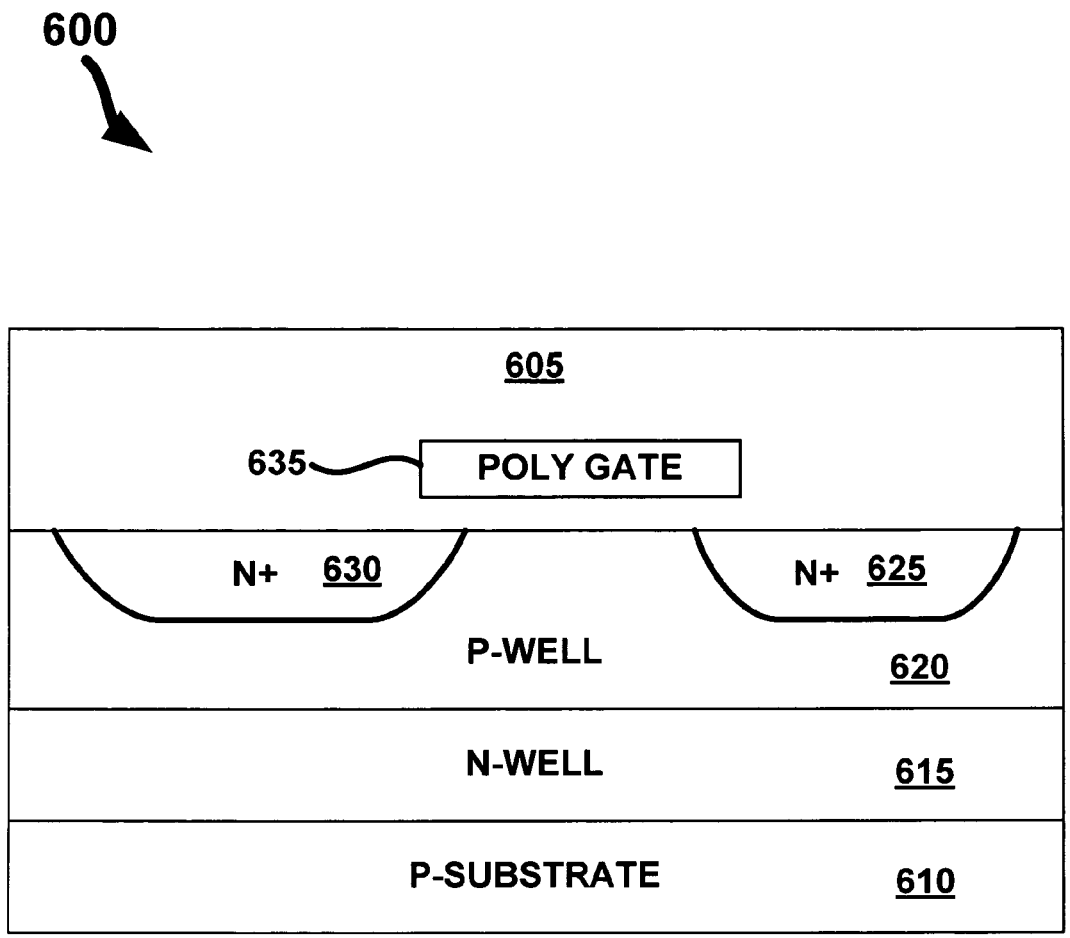
FIG. 6 depicts a cross sectional diagram of a partially formed cell after standard front end of line processes are completed.

FIG. 6 is a cross sectional diagram of a partially formed cell 600 after standard front end of line (FEOL) processes are completed. FEOL processes are generally defined as operations performed on a semiconductor wafer in the course of device manufacturing up to first metallization, and might end with chemical-mechanical polishing (CMP) of $SiO_2$ as an inter-layer dielectric (ILD) 605. FIG. 6 shows a p-type substrate 610, which lies beneath an n-well 615, which, in turn, is underneath a p-well 620. N-junctions 625 and 630 are formed in the p-well 620. Since the data lines may be at −2V, the isolated p-well 620 allows the n-junctions 625 and 630 to always be reverse-biased, even at negative voltages. The select line 635 can be formed as a standard polysilicon gate.

Figure 7:
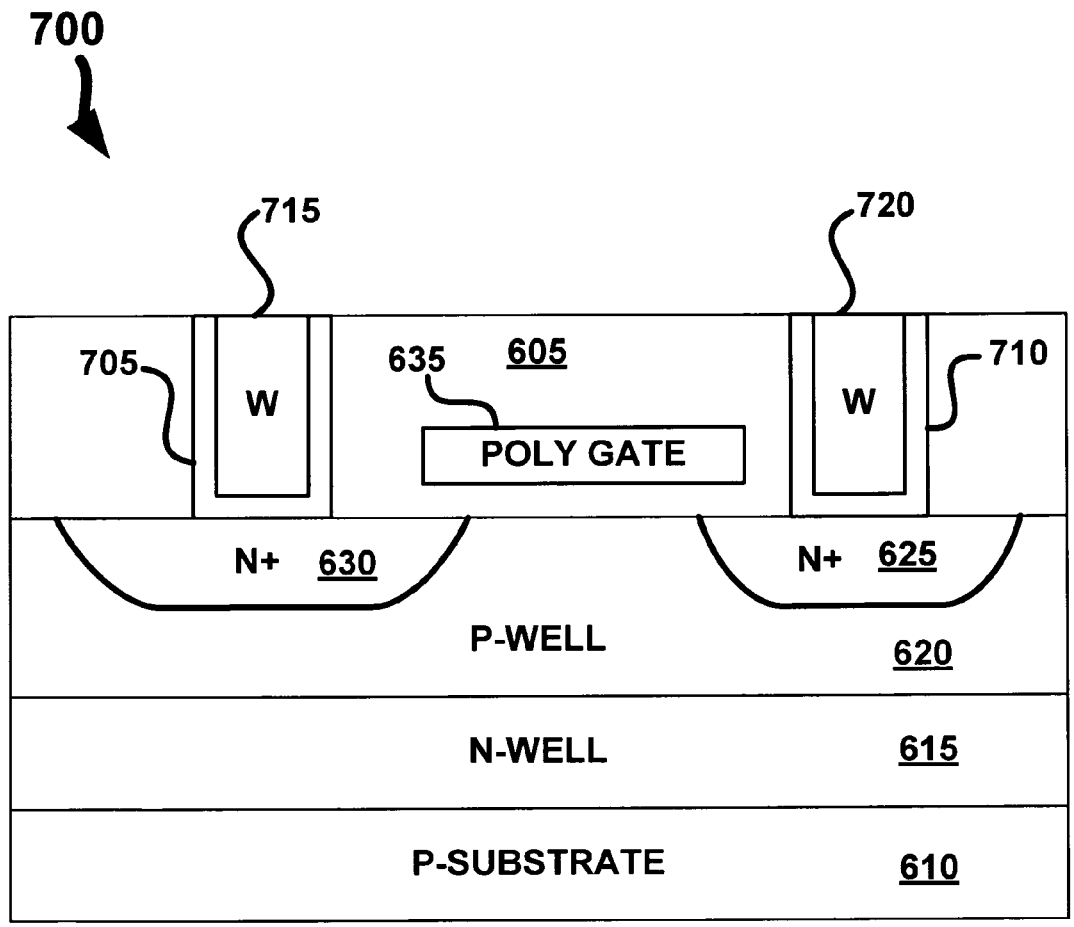
FIG. 7 depicts a cross sectional diagram of the partially formed cell of FIG. 6 after tungsten plug formation.

FIG. 7 is a cross sectional diagram of a partially formed cell 700 after tungsten (W) plug formation. After the FEOL process, the next processing step is formation of contact holes through the ILD 605. A barrier/adhesion layer 705 and 710 of 100 Å of Ti followed by 200 Å of TiN can be sputtered on the wafer, followed by 5000 Å of W, deposited using CVD, followed by etchback or CMP to removeeW on the ILD 605 surface, leaving W plugs 715 and 720 in the contact holes.

Figure 8:
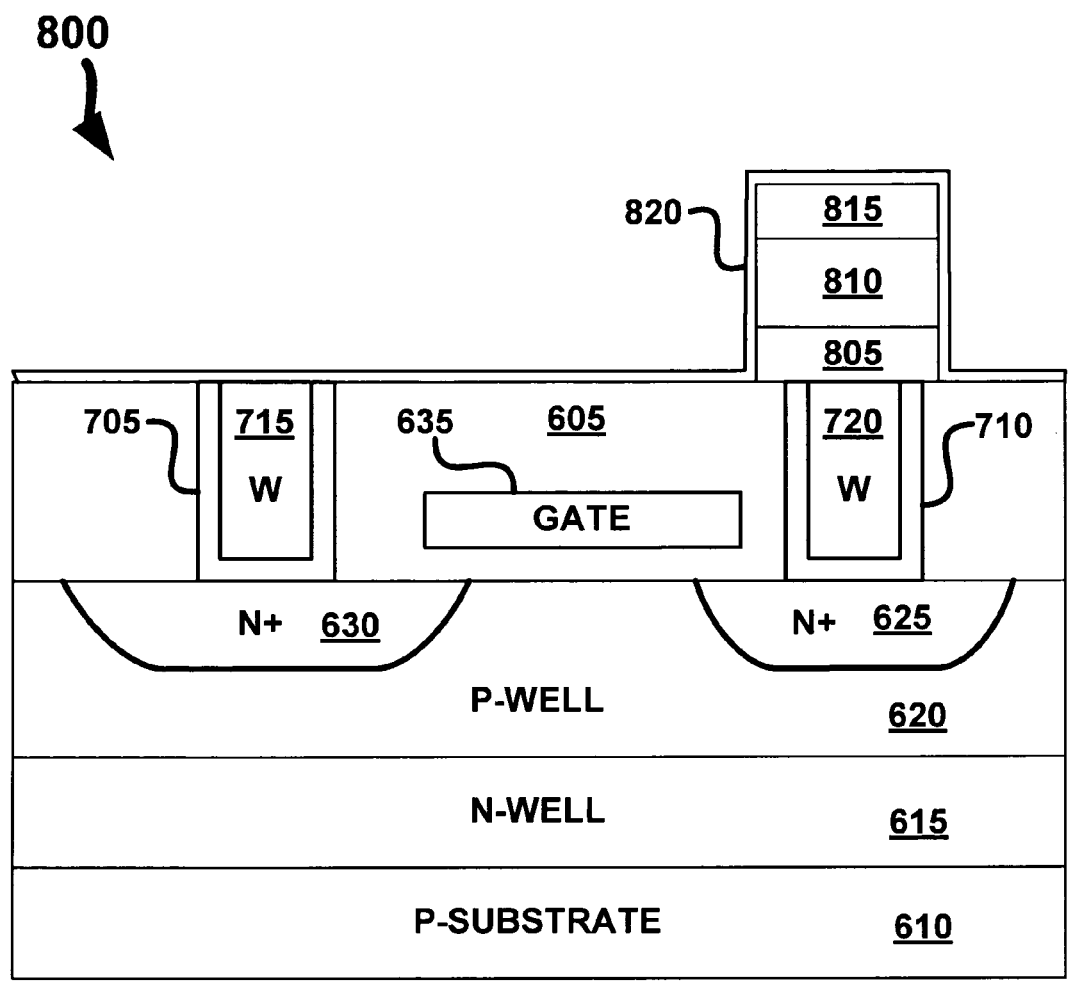
FIG. 8 depicts a cross sectional diagram of the partially formed cell of FIG. 7 after the memory plugs are formed.

FIG. 8 is a cross sectional diagram of a partially formed cell 800 after the memory plugs are formed. First, the bottom electrode 805 is deposited. The bottom electrode 805 can have two layers, a 500 Å thick barrier layer of TiAlN to prevent metal inter-diffusion, followed by a 200 Å seed layer of LaNiO$_3$. These layers can be deposited by sputtering. 2000 Å of memory material 810 having a stoichiometry of Pr$_{0.7}$Ca$_{0.3}$MnO$_3$ can then be deposited at about 600° C. by a physical vapor deposition technique such as sputtering, and then annealed. The top electrode 815 (200 Å of SrRuO$_3$ and another 500 Å of TiAlN) is deposited on top of the memory element 810 via sputtering. Standard photolithography and appropriate multi-step etch processes can then be used to pattern the electrode/memory/electrode layers into memory cell plug. 250 Å of Si$_3$N$_4$ or TiO$_2$ might then be deposited as an etch stop/diffusion barrier 820, to protect the PCMO film from inter-diffusion.

Figure 9:
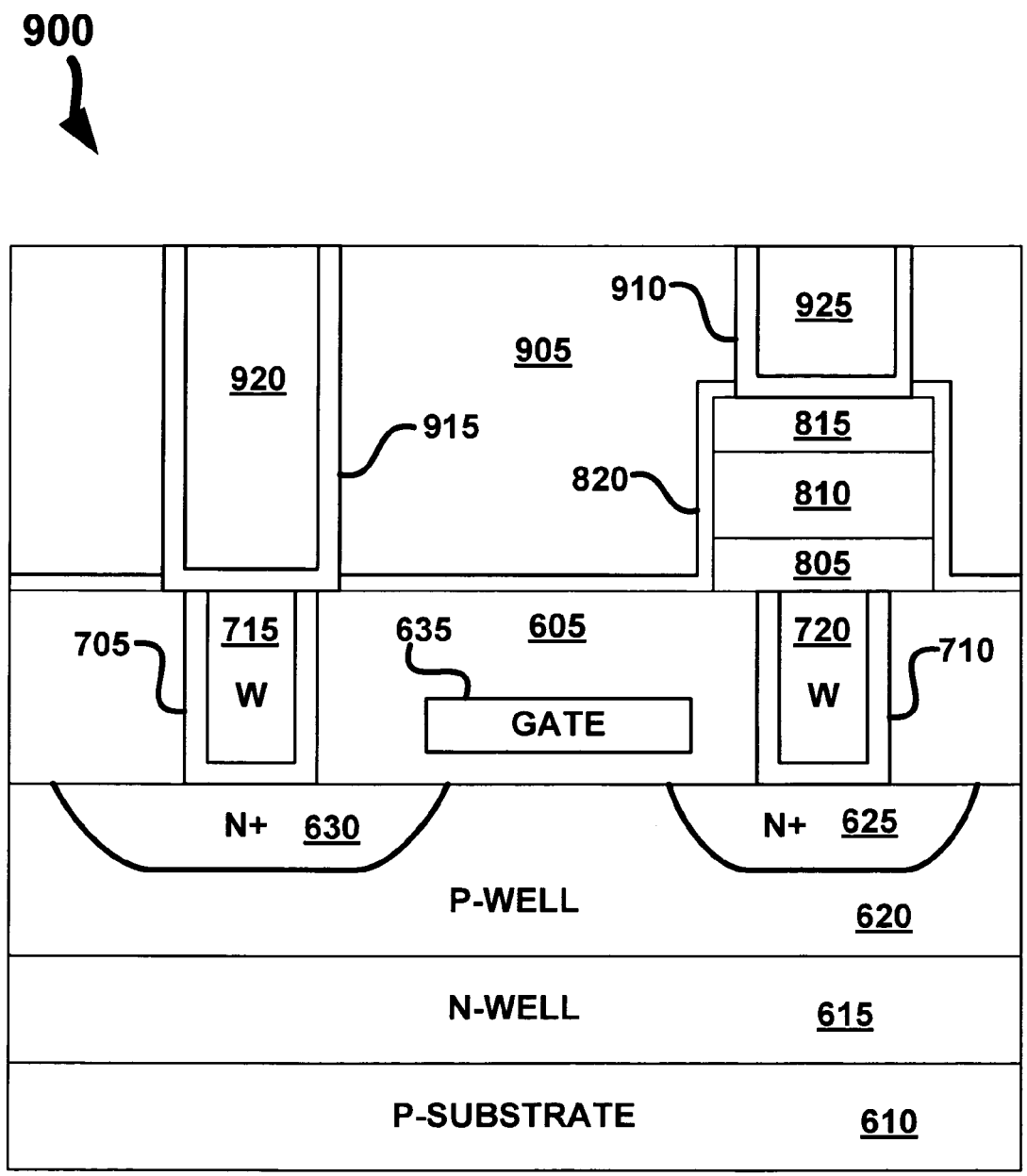
FIG. 9 depicts a cross sectional diagram of the partially formed cell of FIG. 8 after the second set of tungsten plugs are formed.

FIG. 9 is a cross sectional diagram of a partially formed cell 900 after the second set of eW plugs are formed. After the memory plug is fully formed, a thick SiO$_2$ layer as a second ILD 905 is deposited and planarized by CMP. The via holes are then formed with standard photolithography and via etch. The via holes could be filled by depositing a barrier/adhesion layer 910 and 915 of 100 Å of Ti, followed by 200 Å of TiN, followed by eW plug layer 920 and 925 of 5000 Å of W. CMP could then be used to remove eW on the ILD surface 905, leaving the eW plugs 920 and 925 in the via holes.

Figure 10:
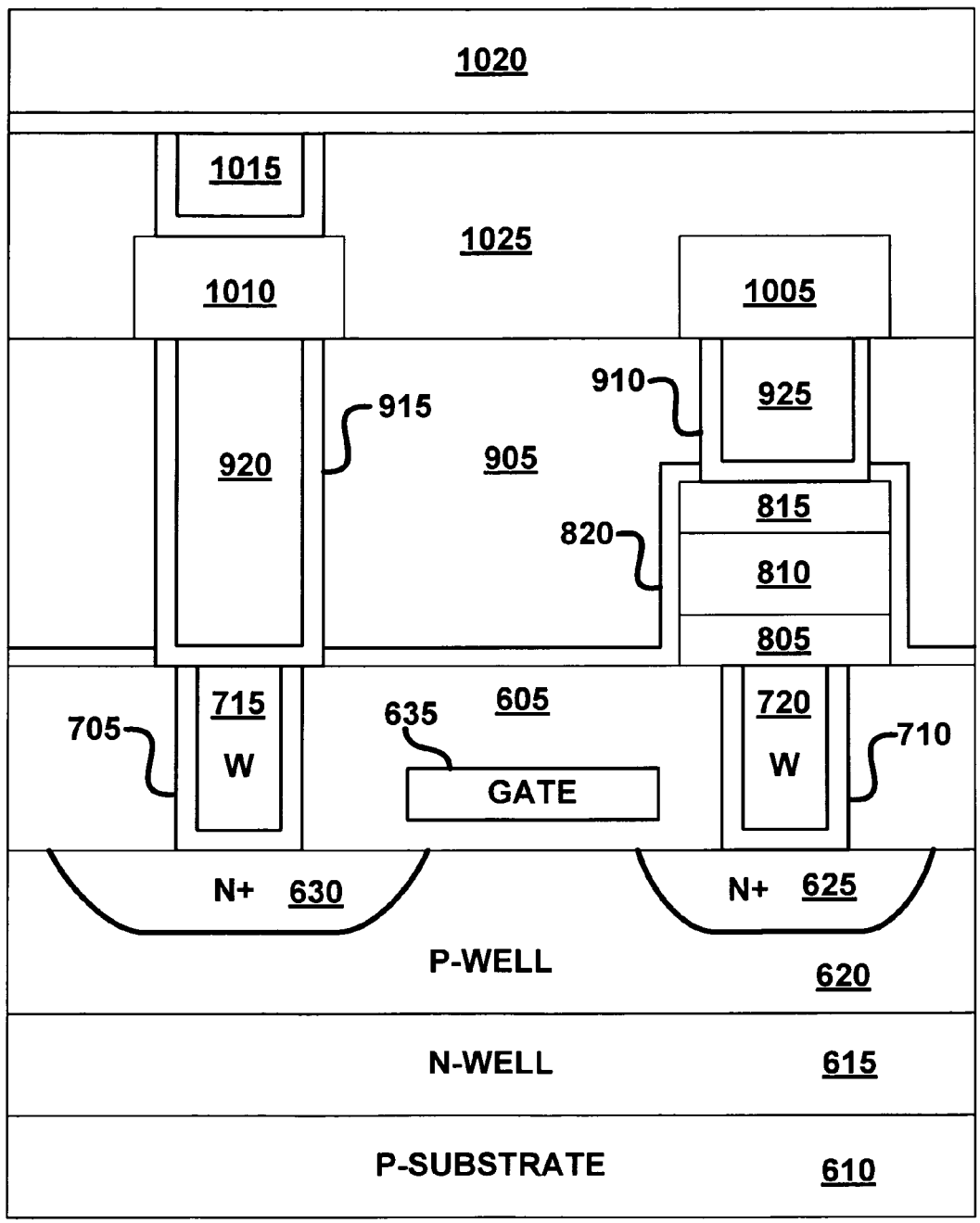
FIG. 10 depicts a cross sectional diagram of a completely formed cell.

FIG. 10 is a cross sectional diagram of a completely formed cell 1000. Using standard processes, two metalization layers can be formed above the partially formed cell 900 of FIG. 9. The first metalization layer can be used to form both the reference line 1005 and a metal pad 1010, which eventually connects two tungsten plugs 920 and 1015. The second tungsten plug 1015 is used to connect the data line 1020, which is formed during the second metalization layer, to the metal plug 1010, through a third ILD 1025, which is used to support the data line 1020.

Figure 11:
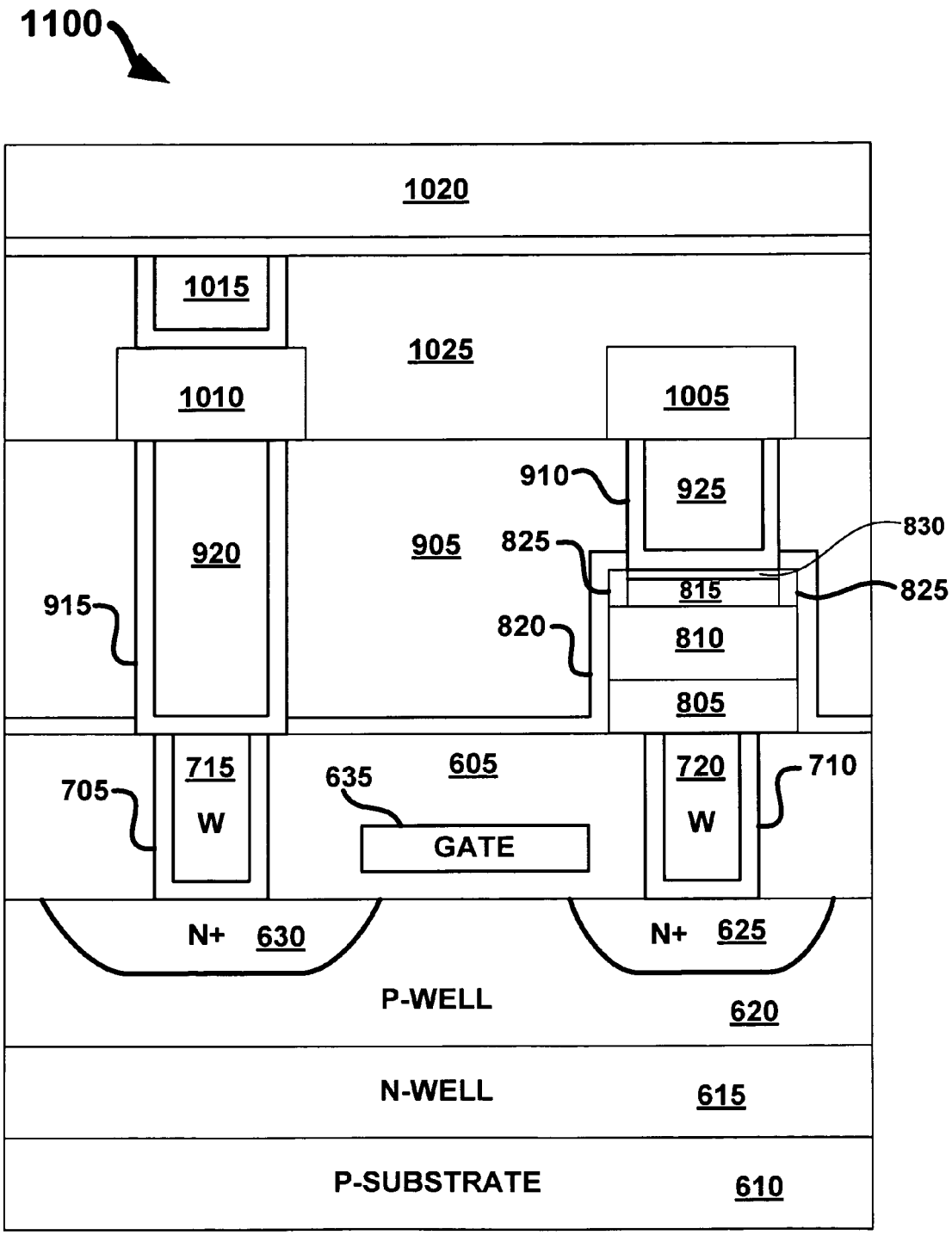
FIG. 11 depicts a cross sectional view of a completely processed integrated circuit wherein the conductive memory devices of the middle memory plug section further include features of a hard mask layer and a spacer.

FIG. 11 depicts a cross sectional view of another completely processed integrated circuit 1100 wherein the conductive memory devices of the middle memory plug section further include features of a hard mask 830 layer and a spacer 825. Except for these features, whose fabrication process is to be presently described, the completely processed integrated circuit 1100 is otherwise the same as the completely processed integrated circuit 1000 depicted in FIG. 10. The spacer 825 can be made of a dielectric material surrounding the top electrode 815. Some examples of the dielectric material are Si$_3$N$_4$, SiO$_2$, TiO$_2$, SiON or Al$_2$O$_3$. The hard mask 830 is typically made of an electrically conductive material having a similar X-Y cross section as the top electrode 815. The hard mask 830 is a masking material that is used as etching mask to protect the film or films underneath from etching in a plasma etch chamber. The hard mask materials can be divided into two categories, insulator or conductor. The popular insulating hard mask materials are oxide and nitride. The popular conductive hard mask materials are binary nitrided metals including TiN, TaN, WN, etc. and ternary nitrided metals including TiSiN, TiAlN, TaSiN, etc. One advantage of the hard mask over a standard photo-resist is that the hard mask can resist a dry etching process requiring elevated temperature. Usually reactive ion etching (RIE) at an elevated temperature is required to etch precious metals or complex metal oxides because of the difficulties associated with their etching, especially the etch byproduct volatility. Due to the impact of previous etch steps defining the profile of bottom electrode 805, multi-resistive state element 810 and top electrode 815, the outer periphery of the multi-resistive state element 810 is often damaged by plasma ions, causing a corresponding leakage current conduction in the Z-direction. This leakage current can short out the current conduction through the bulk of the multi-resistive state element 810, and is therefore undesirable and detrimental to the operation of the conductive memory device. The introduction of the spacer 825 makes the cross sectional area, along the X-Y plane, of the top electrode 815 smaller than that of the multi-resistive state element 810. The spacer 825 creates a resistance between the sides of the electrode 815 and the edge of the multi-resistive state element 810. Hence, the X-Y footprint of the spacer 825 can be made large enough to make the resistance between the sides of the top electrode 815 and the edge of the multi-resistive state element 810 high enough to render the effect of the leakage current conduction negligible.

Figure 12A:
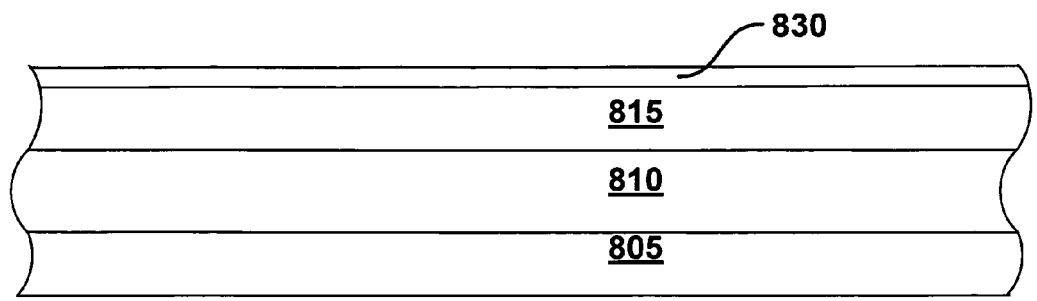
FIG. 12A through FIG. 12E detail an exemplary sequence of various processing steps that could be used for the creation of the hard mask and spacer features of the conductive memory devices of FIG. 11.
Figure 12B:
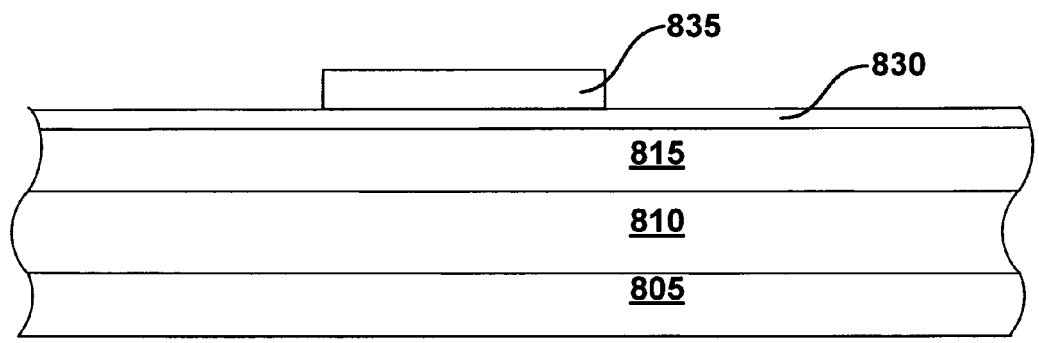
Figure 12C:
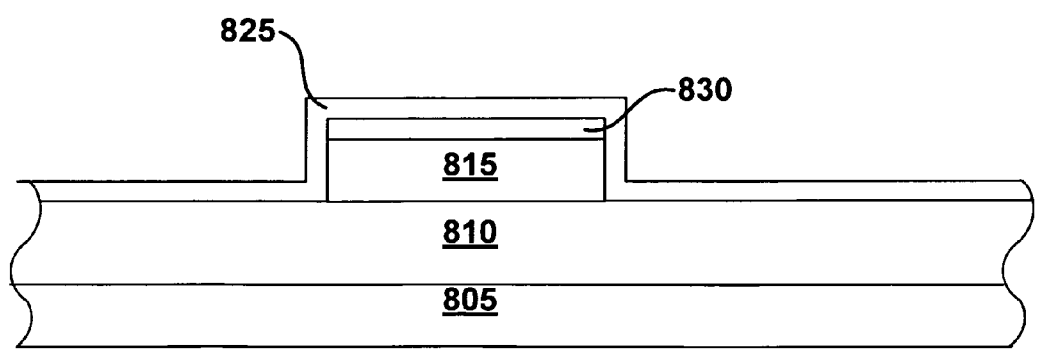
Figure 12D:
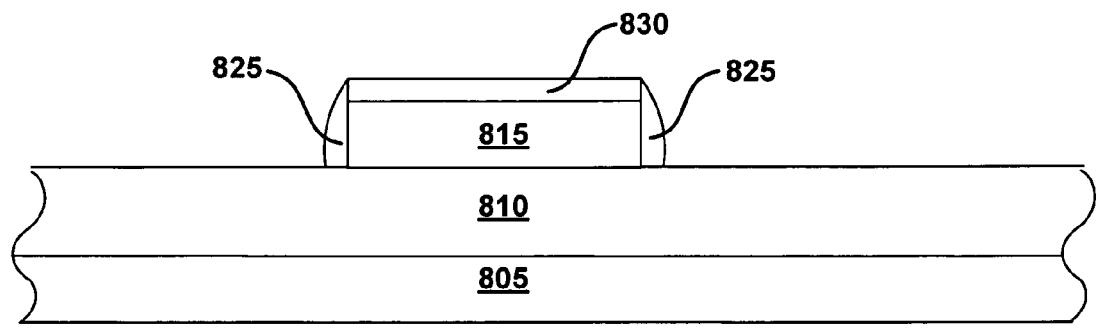
Figure 12E:
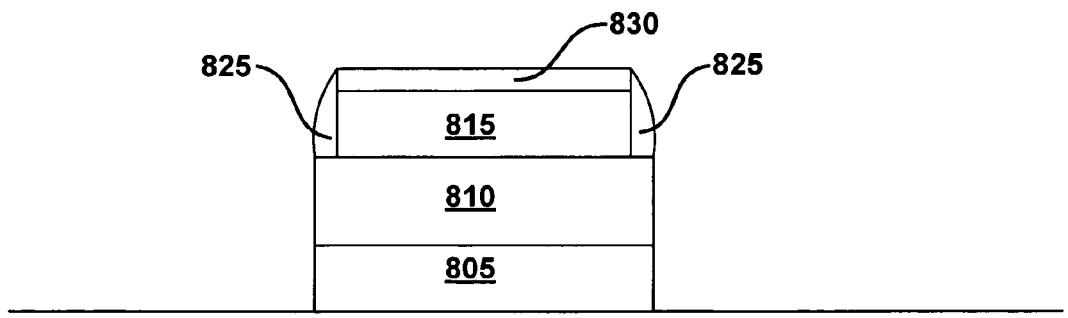

FIG. 12A through FIG. 12E detail an exemplary sequence of various processing steps that could be used for the creation of the hard mask 830 and spacer 825 features of the conductive memory device 1100 of FIG. 11. FIG. 12A illustrates only a conductive memory device following the steps of sputtering a bottom electrode layer 805, sputtering a multi-resistive state element layer 810, sputtering a top electrode layer 815 and depositing a hard mask layer 830. The hard mask layer can be deposited by various means such as Chemical Vapor Deposition, spin coat or sputtering. Like before, the deposition of the multi-resistive state element 810 can be followed by modification of the interface property between the multi-resistive state element 810 and the later deposited top electrode 815. More specifically, the modification of the interface property can be done by ion implantation, in situ argon plasma treatment, in situ oxygen plasma treatment, in situ annealing in argon or in situ annealing in oxygen. FIG. 12B and FIG. 12C illustrate the steps of photo lithographically etching, with a photo resist 835, the hard mask layer 830 and the top electrode layer 815 both having cross sections smaller than that of a later-patterned multi-resistive state element 810. A dielectric material is then deposited on top to form the spacer 825. FIG. 12D illustrates the conductive memory device following an anisotropic dry etching, with a much higher etch rate in the Z-direction than the X- and Y-directions, of the dielectric material to create a sidewall spacer 825 surrounding the side surfaces of the top electrode 815 and the hard mask 830. Finally, FIG. 12E illustrates the conductive memory device following an etching of the multi-resistive state element layer 810 and the bottom electrode layer 805. As an optional measure to further remove the damaged outer periphery of the multi-resistive state element 810, an additional clean-up step of wet etching can be applied to selectively remove 50-150 Å material of the multi-resistive state element sides, thus forming an undercut.

Figure 13:
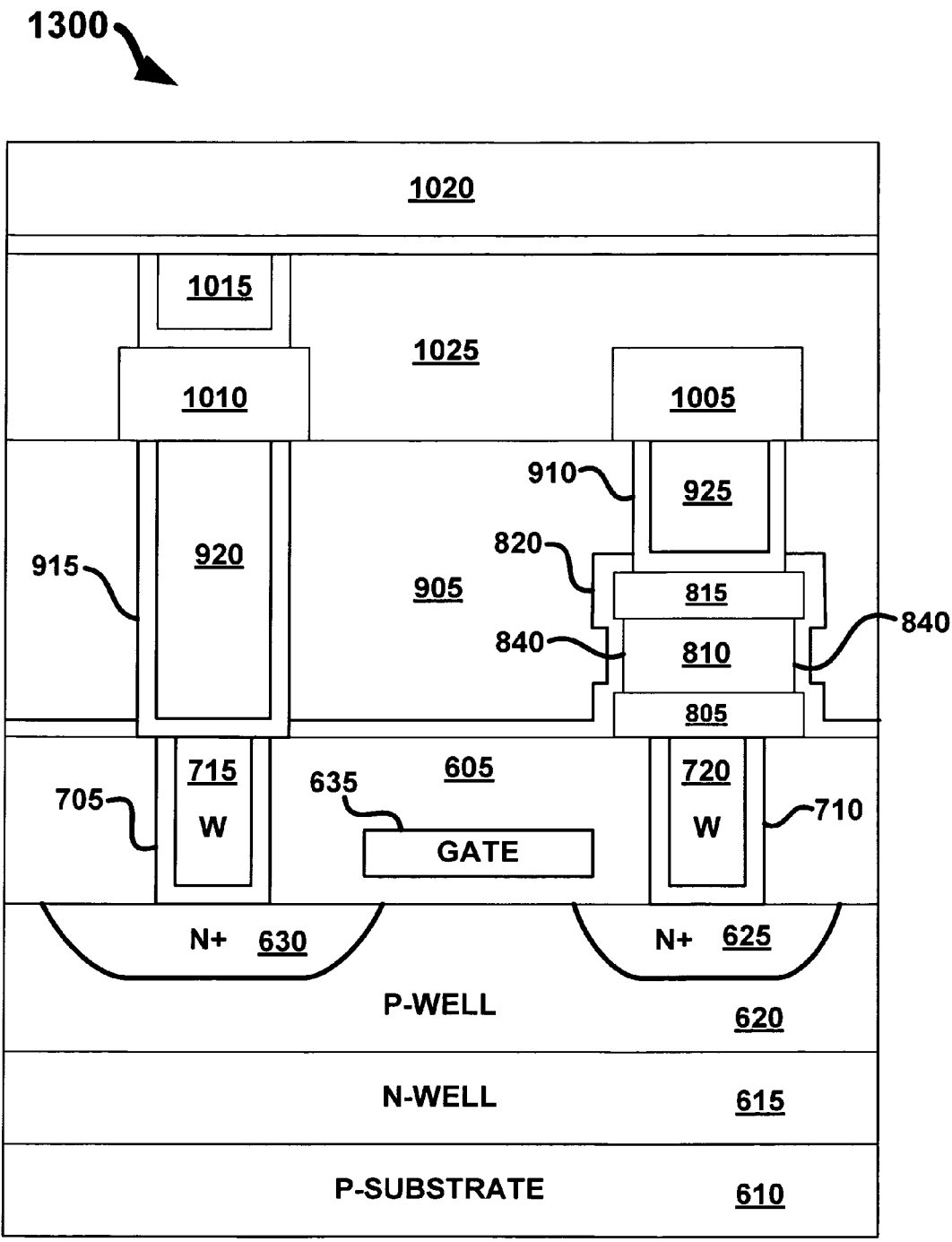
FIG. 13 depicts a cross sectional view of a completely processed integrated circuit wherein the conductive memory devices of the middle memory plug section further include an optional undercut feature.

FIG. 13 depicts a cross sectional view of yet another completely processed integrated circuit 1300 wherein the conductive memory devices of the middle memory plug section include an undercut 840. Geometrically, the X-Y cross section of the bottom electrode 805 is larger than that of the multi-resistive state element 810. Similarly, the X-Y cross section of the top electrode 815 is also larger than that of the multi-resistive state element 810. Except for the undercut 840 the completely processed integrated circuit 1300 is otherwise the same as the completely processed integrated circuit 1000 depicted in FIG. 10. Referring back to FIG. 10 and its accompanying description, after patterning the bottom electrode/multi-resistive state element/top electrode layers into a memory plug an optional clean-up step of wet etching can be applied to selectively remove 50-150 Å of the sides of the multi-resistive state element 810, thus forming an undercut 840 as shown in FIG. 13. The purpose of the undercut 840 is to directly remove the damaged outer periphery of the multi-resistive state element 810 that would otherwise cause an undesirable leakage current conduction in the Z-direction, as explained before.

CONCLUDING REMARKS

Although the invention has been described in its presently contemplated best mode, it is clear that it is susceptible to numerous modifications, modes of operation and embodiments, all within the ability and skill of those familiar with the art and without exercise of further inventive activity. For example, the polarity of the read voltage could be alternated with each read or a n-channel device can be replaced by a p-channel device. Accordingly, that which is intended to be protected by Letters Patent is set forth in the claims and includes all variations and modifications that fall within the spirit and scope of the claims.

What is claimed is:

1. A memory device, comprising:
a memory cell including a first terminal and a second terminal, the memory cell is positioned above a substrate including active circuitry in electrical communication with the first and second terminals, the active circuitry operative to apply a read voltage across the first and second terminals during a read operation to the memory cell and operative to apply a write voltage across the first and second terminals during a write operation to the memory cell, the memory cell including
  a memory element operative to store data as a plurality of resistive states that can be determined by applying the read voltage across the first and second terminals, the plurality of resistive states can be reversibly switched by applying the write voltage across the first and second terminals, and
  a selection device in electrical communication with the memory element and configured to substantially block current flow thorough the memory cell when a fractional voltage is applied across the first and second terminals, the selection device and the memory element are electrically in series with each other and with the first and second terminals,
wherein the first terminal is in electrical communication with only one of a plurality of first conductive array lines in a two-terminal cross-point array, the second terminal is in electrical communication with only one of a plurality of second conductive array lines in the two-terminal cross-point array, the memory cell is positioned at an intersection of its respective first and second conductive array lines, the memory cell is electrically in series with its respective first and second conductive array lines the two-terminal cross-point array is fabricated above and is in contact with the substrate, and the two-terminal cross-point array is positioned over the active circuitry, and the plurality of the first and second conductive array lines are electrically coupled with the active circuitry,
wherein data is read from the memory cell by applying the read voltage across its respective first and second conductive array lines,
wherein data is written to the memory cell by applying the write voltage across its respective first and second conductive array lines, and
wherein the selection device substantially blocks current flow thorough the memory cell when the fractional voltage is applied across its respective first and second conductive array lines.

2. The memory device of claim 1, wherein the substrate comprises a silicon substrate and the active circuitry includes metal-oxide-semiconductors.

3. The memory device of claim 1, wherein the selection device comprises a pair of oppositely oriented diodes that are electrically in series with each other.

4. The memory device of claim 3, wherein the pair of diodes comprises a BARITT diode.

5. The memory device of claim 4, wherein the BARITT diode comprises a layer of p-type semiconductor material in contact with a layer of n-type semiconductor material, the layer of p-type semiconductor material is in contact with a first metal layer and the layer of n-type semiconductor material is in contact with a second metal layer,
  a first Schottky-barrier diode operatively formed by a junction between the first metal layer and the layer of p-type semiconductor material,
  a second Schottky-barrier diode operatively formed by a junction between the second metal layer and the layer of n-type semiconductor material, and
  wherein the first and second Schottky-barrier diodes are oppositely oriented to each other and are electrically in series with each other.

6. The memory device of claim 5, wherein the n-type and p-type semiconductor materials comprise polycrystalline silicon.

7. The memory device of claim 5, wherein one of the metal layers is in electrical communication with one of the terminals of the memory cell and the other one of the metal layers is in electrical communication with the memory element.

8. The memory device of claim 4, wherein the BARITT diode comprises
  a first outer layer of semiconductor material in contact with a first metal layer,
  a second outer layer of semiconductor material in contact with a second metal layer, and
  an inner layer of semiconductor material positioned between and in contact with the first and second outer layers, the inner layer is doped either n-type or p-type, and the first and second outer layers have a doping type that is opposite that of the inner layer,
  a first p-n junction diode operatively created by the contact between the inner layer and the first outer layer,
  a second p-n junction diode operatively created by the contact between the inner layer and the second outer layer, and
  wherein the first and second diodes are oppositely oriented to each other and are electrically in series with each other.

9. The memory device of claim 8, wherein the semiconductor material for the inner and outer layers comprise polycrystalline silicon.

10. The memory device of claim 8, wherein one of the metal layers is in electrical communication with one of the terminals of the memory cell and the other one of the metal layers is in electrical communication with the memory element.

11. The memory device of claim 3, wherein the selection device comprises a layer of semiconductor material sandwiched between and in contact with a first metal layer and a second metal layer,
  the layer of semiconductor material is either n-type or p-type,
  a first Schottky-barrier diode operatively formed by the contact between the first metal layer and the layer of semiconductor material, a second Schottky-barrier diode operatively formed by the contact between the second metal layer and the layer of semiconductor material, and wherein the first and second Schottky-barrier diodes are oppositely oriented to each other and are electrically in series with each other.

12. The memory device of claim 11, wherein the layer of semiconductor material comprises polycrystalline silicon.

13. The memory device of claim 11, wherein one of the metal layers is in electrical communication with one of the terminals of the memory cell and the other one of the metal layers is in electrical communication with the memory element.

14. The memory device of claim 3, wherein the diodes in the pair of diodes comprise identical diode types.

15. The memory device of claim 14, wherein the identical diode types comprise P-I-N diodes.

16. The memory device of claim 14, wherein the identical diode types comprise Zener diodes.

17. The memory device of claim 14, wherein the identical diode types comprise Avalanche diodes.

18. The memory device of claim 14, wherein the identical diode types comprise Tunnel diodes.

19. The memory device of claim 14, wherein the identical diode types comprise four-layer diodes (SCR).

20. A two-terminal non-volatile cross-point memory, comprising:
a substrate including active circuitry;
at least one cross-point array layer positioned over the substrate, each cross-point array layer including
a plurality of first conductive array lines that do not come into contact with one another,
a plurality of second conductive array lines that do not come into contact with one another or with any of the plurality of first conductive array lines, the active circuitry in electrical communication with the plurality of first and second conductive array lines,
a plurality of memory cells, each memory cell including
a first terminal in electrical communication with only one of the plurality of first conductive array lines and
a second terminal in electrical communication with only one of the plurality of second conductive array lines, each memory cell is positioned substantially at an intersection of one of the plurality of first conductive array lines with one of the plurality of second conductive array lines,
the active circuitry operative to apply a read voltage across the first and second conductive array lines of at least one selected memory cell during a read operation to the at least one selected memory cell,
the active circuitry operative to apply a write voltage across the first and second conductive array lines of at least one selected memory cell during a write operation to the at least one selected memory cell, and
each memory cell including
a memory element operative to store data as a plurality of resistive states that can be determined by applying the read voltage across the first and second terminals, the plurality of resistive states can be reversibly switched by applying the write voltage across the first and second terminals, and
a selection device in electrical communication with the memory element and configured to substantially block current flow thorough the memory cell when a fractional voltage is applied across the first and second terminals, the selection device and the memory element are electrically in series with each other and with the first and second terminals.

21. The memory of claim 20, wherein the substrate comprises a silicon substrate and the active circuitry includes metal-oxide-semiconductors.

22. The memory of claim 20, wherein each of the plurality of memory cells in the at least one cross-point array layer has at least one of its terminals in electrical communication with a conductive array line in another cross-point array layer.

23. The memory of claim 20, wherein the selection device comprises a pair of diodes electrically in series with each other and arranged in a back-to-back configuration.

24. The memory of claim 23, wherein the pair of diodes comprises a BARITT diode.

25. The memory of claim 24, wherein the BARITT diode comprises a layer of p-type semiconductor material in contact with a layer of n-type semiconductor material, the layer of p-type semiconductor material is in contact with a first metal layer and the layer of n-type semiconductor material is in contact with a second metal layer,
a first Schottky-barrier diode operatively formed by a junction between the first metal layer and the layer of p-type semiconductor material,
a second Schottky-barrier diode operatively formed by a junction between the second metal layer and the layer of n-type semiconductor material, and
wherein the first and second Schottky-barrier diodes are electrically in series with each other and arranged in the back-to-back configuration.

26. The memory of claim 25, wherein the n-type and p-type semiconductor materials comprise polycrystalline silicon.

27. The memory of claim 25, wherein one of the metal layers is in electrical communication with one of the terminals of the memory cell and the other one of the metal layers is in electrical communication with the memory element.

28. The memory of claim 24, wherein the BARITT diode comprises
a first outer layer of semiconductor material in contact with a first metal layer,
a second outer layer of semiconductor material in contact with a second metal layer, and
an inner layer of semiconductor material positioned between and in contact with the first and second outer layers, the inner layer is doped either n-type or p-type, and the first and second outer layers have a doping type that is opposite that of the inner layer,
a first p-n junction diode operatively formed by the contact between the inner layer and the first outer layer,
a second p-n junction diode operatively formed by the contact between the inner layer and the second outer layer, and
wherein the first and second diodes are electrically in series with each other and arranged in the back-to-back configuration.

29. The memory of claim 28, wherein the semiconductor material for the inner and outer layers comprise polycrystalline silicon.

30. The memory of claim 28, wherein one of the metal layers is in electrical communication with one of the terminals of the memory cell and the other one of the metal layers is in electrical communication with the memory element.

31. The memory of claim 23, wherein the selection device comprises a layer of semiconductor material sandwiched between and in contact with a first metal layer and a second metal layer, the layer of semiconductor material is either n-type or p-type, a first Schottky-barrier diode operatively created by the contact between the first metal layer and the layer of semiconductor material, a second Schottky-barrier diode operatively created by the contact between the second metal layer and the layer of semiconductor material, and wherein the first and second Schottky-barrier diodes are electrically in series with each other and arranged in the back-to-back configuration.

32. The memory of claim 31, wherein the layer of semiconductor material comprises polycrystalline silicon.

33. The memory of claim 31, wherein one of the metal layers is in electrical communication with one of the terminals of the memory cell and the other one of the metal layers is in electrical communication with the memory element.

34. The memory of claim 23, wherein the diodes in the pair of diodes comprise identical diode types.

35. The memory of claim 34, wherein the identical diode types comprise P-I-N diodes.

36. The memory of claim 34, wherein the identical diode types comprise Zener diodes.

37. The memory of claim 34, wherein the identical diode types comprise Avalanche diodes.

38. The memory of claim 34, wherein the identical diode types comprise Tunnel diodes.

39. The memory of claim 34, wherein the identical diode types comprise four-layer diodes (SCR).

* * * * *